(12) United States Patent
Nasrullah

(10) Patent No.: US 7,068,065 B1
(45) Date of Patent: Jun. 27, 2006

(54) SYSTEM AND METHOD FOR DYNAMIC IMPEDANCE MATCHING

(75) Inventor: Jawad Nasrullah, Stanford, CA (US)

(73) Assignee: Innovative Semiconductors, Sunnyvale, CA (US)

( * ) Notice: Subject to any disclaimer, the term of this patent is extended or adjusted under 35 U.S.C. 154(b) by 39 days.

(21) Appl. No.: 10/830,339

(22) Filed: Apr. 22, 2004

Related U.S. Application Data

(60) Provisional application No. 60/536,651, filed on Jan. 13, 2004.

(51) Int. Cl.
*H03K 17/16* (2006.01)

(52) U.S. Cl. .................. 326/30; 326/32; 326/34; 326/87

(58) Field of Classification Search .............. 326/26, 326/27, 30, 31–34, 87; 327/108, 109, 112
See application file for complete search history.

(56) References Cited

U.S. PATENT DOCUMENTS 6,380,758 B1 * 4/2002 Hsu et al. ............... 326/30

* cited by examiner

*Primary Examiner*—Anh Q. Tran
(74) *Attorney, Agent, or Firm*—Michael Hetherington

(57) ABSTRACT

An integrated circuit provides dynamic, on chip resistor trimming, including a digital control loop for stabilizing impedance matching among multiple devices communicatively linked over a data transmission line. The digital control loop stabilizes input/output impedance matching of various devices to within a precise ohmic range that is far narrower than standard process variations, such as sheet resistance, within the components themselves. The impedance matching circuit also overcomes EMI problems normally associated with digital control and thus provides dynamic on-chip digital control without non-linearity and with tighter tolerance than is presently possible. Accordingly, the circuit boosts performance of peripheral devices that communicate over a standard USB port, without the need for a computer as a go between or intermediate interface. This makes device to device communication possible as between USB On-the-Go capable devices.

6 Claims, 15 Drawing Sheets

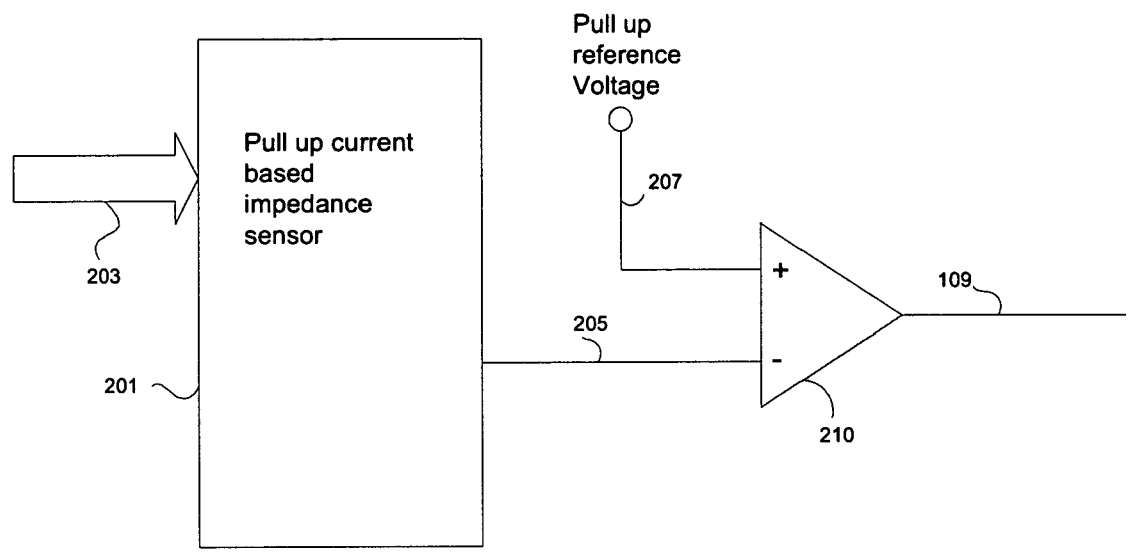
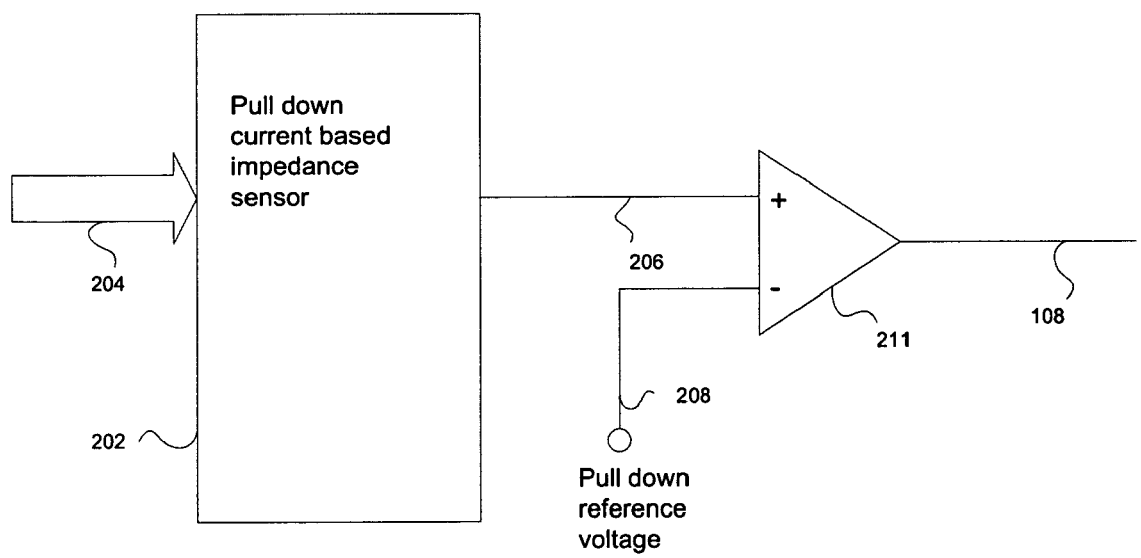
Figure 2

FIG 7 (Block 103)

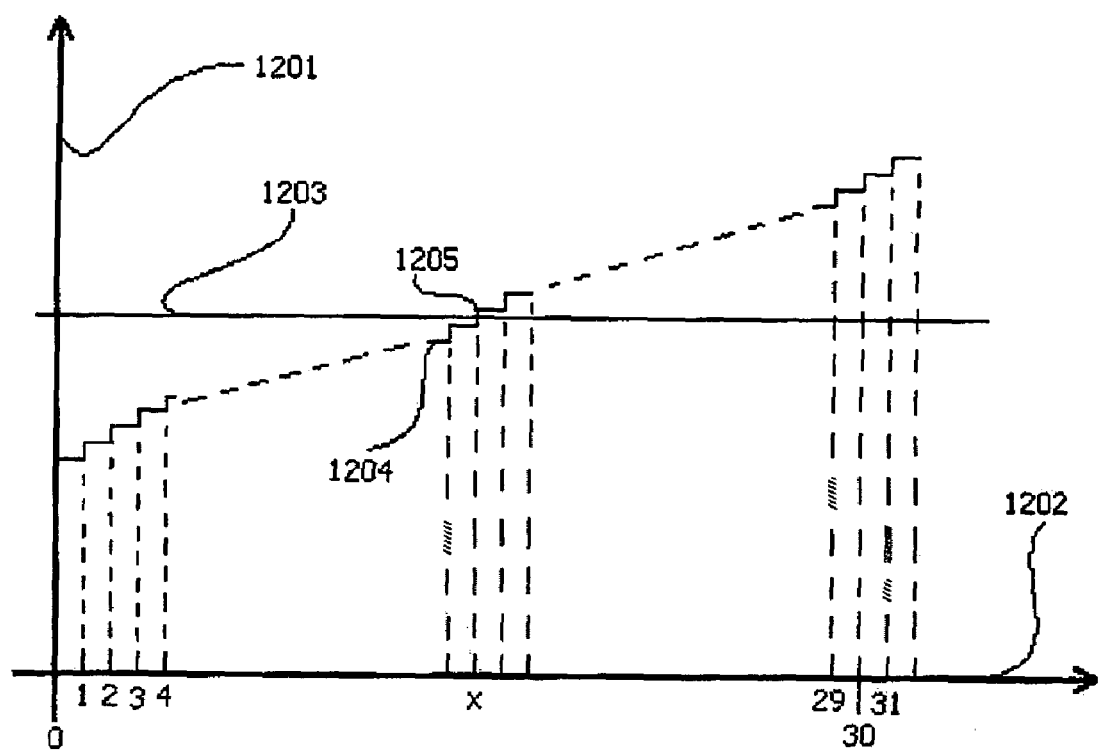
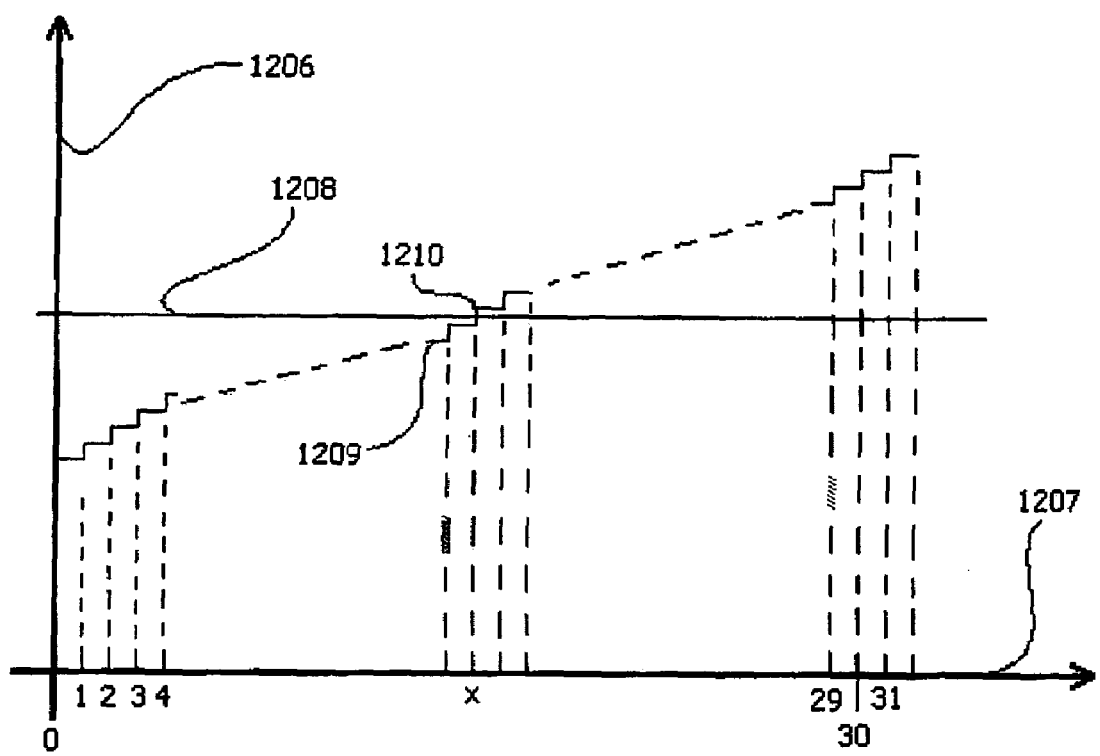
Fig 12

$I_{known}$ for a typical five-bit control scheme vs. locking code, ideal and inplemented version Rout target = 37 Ohm

SYSTEM AND METHOD FOR DYNAMIC IMPEDANCE MATCHING

CROSS-REFERENCE TO RELATED APPLICATION

This patent application claims the benefit of U.S. provisional patent application Ser. No. 60/536,651, filed Jan. 13, 2004, which is incorporated herein by reference.

BACKGROUND

1. Field of the Invention

The field of the present invention relates generally to integrated circuits. In particular, the field of the invention relates to dynamic control for matching of impedance using on-chip components over a high-speed data link or transmission line. A dynamic control circuit enables matching of on-chip impedances with tighter tolerance than the impedance properties inherent in the integrated circuits due to manufacturing process variations.

2. Background of Related Art

There is an increasing need for a system that enables a portable, low power device, such as a cell phone, PDA, or the like to transfer data reliably via a USB (universal serial bus) interface directly to a host device, such as a printer, digital camera, MP3 player or the like without having to use a PC as a middleman. Although many devices currently support USB, generally such devices do not have the ability to act as hosts. Design of a host circuit requires impedance matching on-chip in order to match the driver to transmission line. An off-chip impedance matching results in an increased number of IC pins that is undesirable. Signal distortions resulting from impedance mismatches between input/output (I/O) buffer circuitry of the communicating devices, and the transmission line impedance can be significant.

On-chip components—such as resistors can vary due to fabrication process variations in the integrated circuitry of the devices. Semiconductor processes typically result in components having actual resistance values that differ from the nominal design value within a statistical range. That is, a resistor designed to have a nominal resistance of 75 ohms may end up having an actual resistance ranging from 60 ohms to 90 ohms, a +/−20% variation due to variation in the resistivity (sheet resistance) of the semiconductor material on which the resistor is fabricated. When the element value is critical to the operation of the circuit, such variation may adversely affect the I/O impedance and degrade performance of the circuit.

For optimum performance a high-speed data transmission circuit, such as one capable of utilizing USB, requires a close match between the termination impedance of the circuit and the impedance of the transmission line to which the circuit is coupled. Too much variation in the termination impedance due to variations in the manufacturing process may result in unacceptable performance, such that some integrated circuits are unusable.

Accordingly, various designs for I/O buffers have been proposed to match the output impedance of the I/O buffer with the transmission line impedance. Without proper impedance matching, overshooting, undershooting, and signal distortion can occur, particularly in high-speed data transfer.

One approach for controlling output impedance described in U.S. Pat. No. 6,429,685 attempts to achieve matching impedance using an operational amplifier to control the conductance of a three terminal semi-conductor device such as an FET, CMOS, or bi-polar transistor. This approach has the disadvantage that offset and bias currents of the operational amplifier can cause drift of the output impedance due to temperature changes. Also, this approach requires added complexity to stabilize a reference voltage. Otherwise, any noise on the reference voltage causes cyclical variation of impedance over time. That is, impedance will vary with the noise signal that appears at the reference voltage terminal resulting in loss of transmission signal integrity. In addition, this design integrates a slew-rate controlled driver as well as an impedance control in one circuit that is very application specific and is not a general impedance control method.

Also, conventional approaches as exemplified by U.S. Pat. No. 6,429,685 teach that digital on-chip impedance control techniques have many disadvantages including using discrete steps which generate high frequency components and produce problems with electromagnetic interference (EMI). See column 1, lines 37–43.

Therefore, what is needed is an on chip or integral system for reliably matching I/O impedance to enable data transfer from one peripheral device to another over a USB interface without first connecting the device into a compatible PC to download files, then uploading files from the PC onto the new device. There also is a need to provide improved compatibility among components in an integrated circuit used for an I/O buffer for high-speed data transfer between different devices in general. This need becomes critical when there is a wide range of manufacturing process variation, such as varying sheet resistance.

Other conventional solutions typically incorporate the use of off-chip components to implement matching termination networks. However, such solutions disadvantageously can use up a large number of IC pins and board space.

Other on-chip solutions require the use of separate test I/O pads for determining suitable impedance matching. For example, one external test pad is typically used to determine the suitable pull up circuit impedance, and a separate additional test pad is used to determine suitable impedance matching for the pull down circuit of the output buffer. Thus, separate external impedance calibration resistors are used for each I/O buffer section. The use of additional test pads and external resistors has disadvantages of increased board density and surface area, reduced reliability and increased cost.

One approach, for example, as disclosed in U.S. Pat. No. 6,064,224, by Esch, et al., describes an on-chip impedance matching network using up down counters that are always changing by small amounts. Therefore, pull up and pull down impedances are always changing by small amounts. This is reflected in small voltage changes across the load connected to the output of the FET network. This in turn adds another component of noise in the system attempting to regulate pull up and pull down impedance. A single FET network between the pull up and pull down driver switches includes two parallel sections for determining impedance of the pull up and pull down drivers, respectively, when pull up and pull down switches are closed. Due to the parallel connections of the first and second sections, the impedance of the pull up driver affects the impedance of the pull down driver, and these values are not independent of one another.

In another approach, (A new impedance control circuit for USB2.0 transceiver, Kyoung-Hoi Koo; Jin-Ho Seo; Jae-Whui Kim, ESSCIRC 2001. Proceedings of the 27th European Solid-State Circuits Conference, 18–20 Sep. 2001, Villach, Austria) digitally controlled transistor arrays are used as impedance elements as opposed to passive resistors.

Such implementation does not result in an impedance that is linear over voltage range and also suffers from extra parasitic capacitance making it unsuitable for very high-speed applications.

In order to meet the demand for low-cost, high-speed serial data communication, CMOS technology is being widely used for high-speed serial data links. To improve data transmission speed in CMOS technology, various types of drivers have been proposed for better signal integrity.

In another conventional solution, current-mode differential CMOS drivers use differential switches to pull down the drive signal (while resistors are used to pull it up). However, with the increased use of scaled-down CMOS technology, the speed of a transmitting device is limited by large parasitic capacitance present in the drain area of the driver transistors, bonding pad, and electrostatic discharge (ESD) protection The same problems arise in the receiver side-parasitic capacitance and inductance in the I/O pad distort the received signal.

Therefore, what is needed is an improved system and method for dynamically matching impedances without resorting to transistors and which enables tighter control over impedance variations without regard to differing sheet resistance of individual circuit components.

SUMMARY

In accordance with the foregoing and other objectives, an aspect of the invention comprises an integrated circuit providing dynamic, on chip resistor trimming, including a digital control loop for stabilizing impedance matching among multiple devices communicatively linked over a transmission line. An aspect of the digital control loop stabilizes input/output impedance matching of various devices to within a precise ohmic range that is far narrower than standard process variations, such as sheet resistance, within the components themselves.

In contrast to conventional teaching as set forth in U.S. Pat. No. 6,429,685 above, an aspect of the invention overcomes EMI problems normally associated with digital control and thus provides dynamic on-chip digital control without non-linearity and with tighter tolerance than is presently possible.

Accordingly, an aspect of the present invention boosts performance of peripheral devices that communicate over a standard USB port, without the need for a computer as a go between or intermediate interface. This makes device to device communication possible as between USB On-the-Go capable devices.

Another aspect of the invention provides the advantage that any device equipped with a USB interface will be able to trade data with any other device that has a standard USB port-such as a printer, digital camera, MP3 player or keyboard, at previously unattainable high levels of transfer rates and reliability. However, the two communicating devices do not have to be limited to USB transmit/receive protocols.

Our approach also uses a reference voltage however the changes in the reference voltage have very small impact on the impedance matching. This is achieved by first converting the reference voltage to a reference current. Only binary weighted versions of these currents currents are mixed together for the sake of impedance control. The size of the smallest current step is large enough compared to the to the system noise. Therefore the impedance matching system is largely immune to the noise in the reference voltage.

The impedance matching system is largely immune to the noise in the reference voltage. Howeve,r the changes in the reference voltage have a very small impact on the impedance matching. This is achieved by first converting the reference voltage to a reference current. Only binary weighted versions of these currents are mixed together for the sake of impedance control. The size of the smallest current step is large enough compared to the to the system noise. Thus, the system noise does not affect the impedance matching.

BRIEF DESCRIPTION OF THE DRAWINGS

These and other aspects and advantages of the invention may be appreciated from the following detailed description together with the drawings in which:

FIG. 2 is a block diagram of the control sense block shown in FIG. 1 in accordance with an aspect of the invention.

FIG. 3 is a schematic diagram of the pull-down current based impedance sensor as shown in FIG. 2 in accordance with an aspect of the invention.

FIG. 12 is a schematic diagram showing voltages on nodes 206 and 208 in accordance with an aspect of the invention.

DETAILED DESCRIPTION

Figure 1:
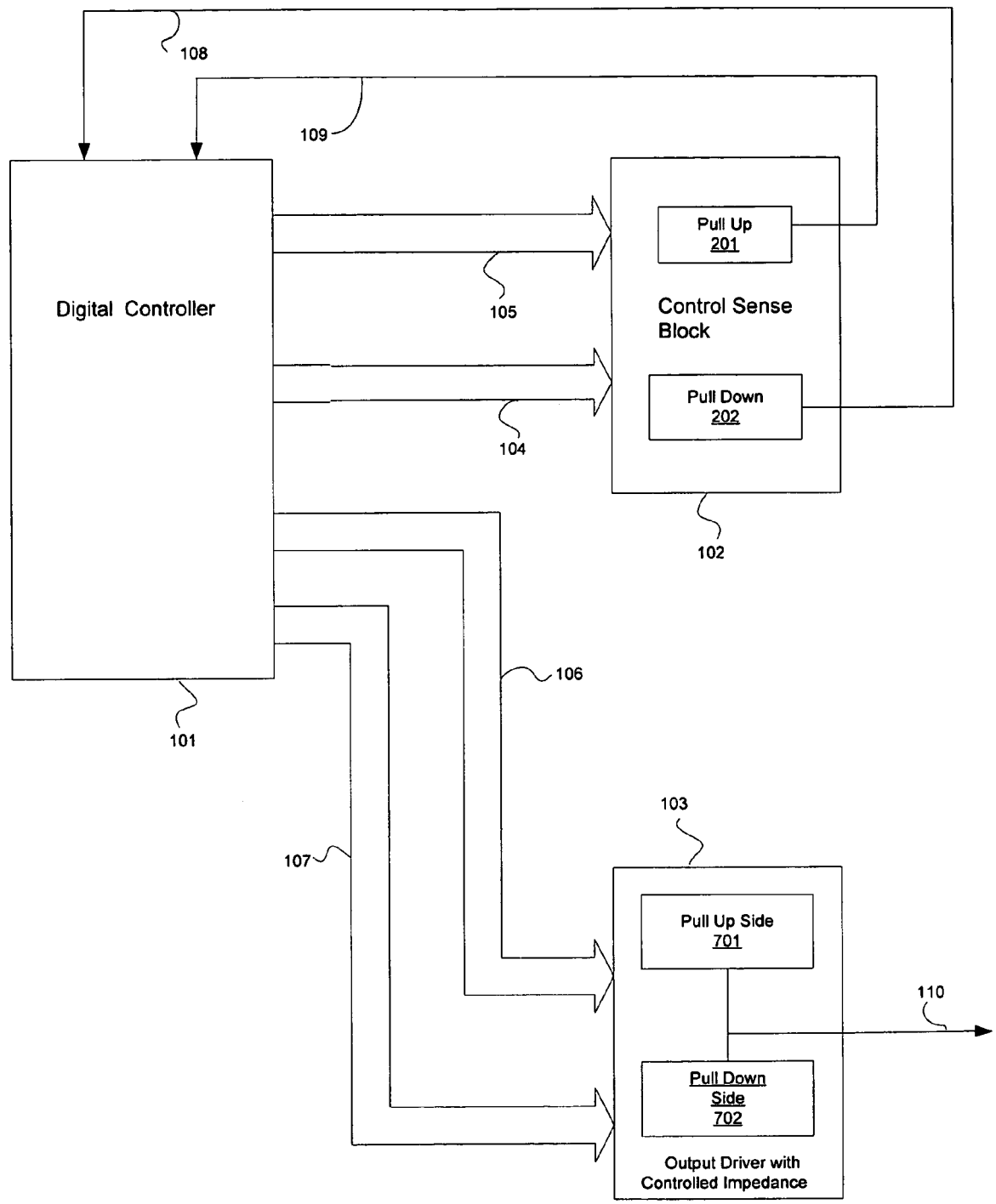
FIG. 1 shows an overall block diagram of a digital control circuit providing impedance matching on a data transmission line in accordance with an aspect of the invention.

FIG. 1 shows the basic functional blocks of a preferred embodiment for matching impedance over a data transmission line. In overview, a digital controller first performs calibration for pull-down and pull-up sides on output replica circuits. The controller then determines the correct values of digital controls and applies those values to the actual output driver when the output line is quiet. During calibration, the controller sends a counter output to a control sense block and goes through a number sequence step by step. After each step, the controller looks at the feedback lock signals to determine if the applied value is the correct value or not. By going through a range of values, the controller determines the correct target value or it determines if the target is outside the calibration range. This procedure is repeated for the pull-up and pull-down sides and correct values are determined for unidirectional bus 106 that controls pull-up impedance of an output driver and unidirectional bus 107 that controls the pull-down impedance of an output block. 106 and 107 are only updated when the output line 110 is quiet and there is not signaling activity. This makes it possible to avoid any resulting glitches from corrupting the data on the line.

FIG. 1 is described in greater detail as follows. Digital controller 101 comprises a microprocessor that executes instructions for generating control signals that are, for example, five bits long. However, one skilled in the art will recognize that the control signals can be any number of convenient bits long.

Also, the control signals are not limited to conventional bits, but can be a binary signal represented by electron spin direction. For example, Q bits as used in quantum computation may be used for control signals. What is important is that the control signals represent uniform steps.

Pull up control signals, for example, bits BU0–BU4 are output on a unidirectional bus 105 to a control sense block 102 to control a pull-up lock feedback signal generated by control sense block 102. A corresponding pull-up lock feedback signal is generated at control sense block 102 and applied over line 109 back to digital controller 101.

Pull down control bits $B_0$–$B_4$ are sent from digital controller 101 on unidirectional bus 104 to control sense block 102 to control the pull-down lock signal. A corresponding pull-down lock feedback signal is generated at control sense block 102 and applied over line 108 to digital controller 101.

In response to the feedback signals from control sense block 102, digital controller 101 provides control bits SU0–SU4 over unidirectional bus 106 that controls pull-up impedance of an out put driver in output block 103. Further, in response to the feedback received from control sense block 102, digital controller 101 provides control bits S0–S4 over unidirectional bus 107 that control the pull-down impedance of output block 103.

Output lead 110 appears to an external device or circuit as a voltage source in series with a resistance. That resistance is the output impedance of output block 103. As will be explained below, the output impedance is adjusted to match the characteristic impedance of a device connected over a transmission line to output lead 110.

FIG. 2 is a block diagram of the circuit contained in control sense block 102 of FIG. 1. The control sense block has two sections, one for the pull-up side calibration and the other for pull-down side calibration. The two sections are functionally similar. Each side has a reference-current based impedance sensor (201 and 202). The impedance sensor outputs an analog voltage 205 in response to an applied digital input. The analog output voltage is compared against a known reference 207 using a comparator circuit 210. The comparator circuit output is a single-bit digital output signal that is fed back to the digital controller. This feedback signal indicates to the controller if the control sense block output is higher than the reference voltage or lower than reference voltage for an applied digital input. FIG. 2 is described in greater detai as follows.

Block 102 comprises two independent current based impedance sensors 201 and 202. Current based impedance sensor 201 receives pull-up control bits $B_{U0}$–$B_{U4}$ on bus 203 and generates an output voltage on lead 205. Lead 205 is the negative input of comparator 210. A reference voltage $V_{ref\ up}$ is applied to positive lead 207 of comparator 210. Reference voltage $V_{ref\ up}$ is compared with the voltage on lead 205 to produce pull-up lock signal on lead 109 at the output of comparator 210. When the voltage on comparator negative input lead 205 goes higher than the voltage on input lead 207, the pull-up lock signal on lead 109 goes from high to low.

Conversely, when the voltage on lead 205 goes below the voltage on lead 207, the pull-up lock signal on lead 109 goes from low to high. By comparing the two analog input voltages, comparator 210 produces a digital signal, the pull-up lock signal, at its output lead 109.

Similarly, current based impedance sensor 202 receives digital signals $B_0$–$B_4$ on input bus 204 that control pull-down impedance. Sensor 202 converts digital signals $B_0$–$B_4$ to an analog voltage on the positive input lead 206 on comparator 211 as explained infra. A reference voltage $V_{ref\ down}$ is applied to the negative input lead 208 of comparator 211. When the voltage on the positive input lead 206 of comparator 211 goes lower than the voltage on input lead 208 of comparator 211 the voltage on comparator output lead 108 goes from high to low. When the voltage on the positive input lead 206 of comparator 211 goes above the reference voltage on input lead 208, the voltage on output lead 108, goes from low to high.

FIG. 3 is a schematic of the pull-down current based impedance sensor 202 of FIG. 2. Referring to FIG. 3, an output voltage at node 307 is proportional to the binary number represented by control bits $B_0$–$B_4$ on input bus 314. This is the same as the control signal bus 104 shown in FIG. 1. It is understood that an external precision resistor is connected between node 310 and $V_{SS}$ (or the negative/low v rail). The precision resistor is used to adjust the output voltage at node 307 so that the pull-down lock 108 and pull-up lock 109 will signal to the digital controller 101 that control bits $B_{U0}$–$B_{U4}$ and control bits $B_0$–$B_4$ are set to an optimal value for matching impedance at node 110 in FIG. 1.

Due to the external precision resistor, such impedance matching is constant in the face of varying temperatures. Also, such impedance matching can be held to a very tight range of tolerances that are less than those resulting from the presence of integrated circuit manufacturing process variations.

Referring again to FIG. 3, circuit blocks 301, 302, 303, 304, 305 and 306 provide weighted values of $I_{ref}$. Each circuit block 301, 302, 303, 304, 305, 306 comprises one or more branches of first and second serially connected FETs. In a preferred embodiment, the FETs are P channel MOS FETs. In each branch, the first and second FETs are connected in series between a positive supply $V_{DD}$ and output node 307.

The source of each first FET in each branch is connected to the positive supply $V_{DD}$. That is, FETs 531 and 533 in block 301; FETs 335 and 337 in block 302; FETs 339, 341,343 and 345 in block 303; FETs 347 and 349 in block 304 and 351 in block 305, each have a source connected to $V_{DD}$. Each first FET also has a drain connected to the source of a second corresponding FET in each branch.

FIG. 3 shows the circuit of pull down current based impedance sensor 202 in FIG. 2. This circuit functions on the principle of a current-based digital-to-analog converter. The digital input controls the amount of current flowing through a replica of the output driver resistance section. Flow of this controlled current through the resistance generates analog voltage output on node 307. This voltage output is compared against a known voltage reference to generate the lock signal feedback for the digital controller.

The circuit is comprised of one reference current generator 390, a parallel connected array of six digitally controlled current mirror groups, 306, 305, 304, 303, 302 and 301, one impedance block 313, and one pull down current step adjustment controller 330.

The reference current generator 390 has a first terminal connected to line 350 which is at high system voltage Vdd, and a second terminal which is connected to control line 310. The reference current generator works on the principle of current mirror. An external circuit pulls a reference current (Iref) out of the node 310. This reference current is generated by applying a precise reference voltage across an external precision resistor (not shown in the FIG. 3). Transistor 356 is a diode connected transistor that generate a mirror control voltage on control line 310 based on Iref as its drain current.

The control line 310 connects to the digitally controlled current mirrors and the mirror control voltage on line 310 sets the output current of each of the six digitally controlled current mirrors to a multiple of the reference.

Each of the six digitally controlled current mirrors has a series switch transistor to turn the current on or off. The gate of the switch transistos are connected to digital outputs of step-adjustment controller 330 via enable lines 315, 316, 317, 318, 319, 320, 321, 322, 323, 324 and 325. Step-adjustment controller 330 controls these current mirrors based on the digital input B0–B4 from digital controller. The step adjustment controller sets up digital signals on these enable lines to produce either no output current or an output current that is some multiple of the reference current in response to the logic voltage levels that appear on the enable lines.

The parallel connected array of the current mirrors is connected between the high system voltage Vdd on line 350 and line 307. The impedance block has a first terminal that is connected to line 307, and a second terminal that is connected to low system voltage Vss, and is connected so that the sum of the output currents of all enabled current mirrors flows through the impedance block to generate an output voltage on line 307.

The enable lines are the outputs of the pull down current step adjustment controller which converts 5 bit wide binary numbers on input bus B0–B4 to patterns of voltage Vdd (logic 1) and voltage Vs (logic 0) on the enable lines which activate none, all, or a portion of the six digitally controlled current mirrors, and thereby makes the output voltage adjustable to discrete values between two preset levels in response to a binary number on input bus B0–B4.

The reference current generator 390 comprises two P channel field effect transistors (Pch-FETs), 355 and 356, connected in series where the source terminal of Pch-FET 355 connects to the high system voltage Vdd on line 350, the gate terminal of Pch-FET 355 connects to the low system voltage Vss, the drain terminal of Pch-FET 355 connects to the source terminal of Pch-FET 356, and the drain and gate terminals of Pch-FET 356 connect together on control line 310. This series connection sets Pch-FET 355 to its minimum impedance state (also known as turned-on state) and allows reference current to flow through Pch-FET 355 and Pch-FET 356.

With reference to FIG. 3 and to the design rules infra, Reference current (Iref) can be determined as follows: $I_{ref}=(K_{ref} \times V_{ref-bg})/R_{ext}$. Where $R_{ext}$ is tightly controlled and $K_{ref}$ is a scale factor chosen by the designer for a specific application, typically with K=2. $V_{ref-bg}$ is the reference voltage, typically generated by a band-gap circuit.

The reference current flows through diode connected Pch-FET 356. This diode connected transistor 356 acts like a Current to Voltage converter and converts the reference current to a voltage that is used as current mirror control voltage on node 310. This control voltage on node 310 sets the output current of each of a plurality of digitally controlled current mirrors. In this example six groups of current mirrors are shown (301, 302, 303, 304, 305, 306).

The function of any of the parallel-connected circuits will be explained using digitally controlled current mirror 305, comprising upper Pch-FET 351, and lower Pch-FET 352, as an example. Upper Pch-FET 351 is connected in series with lower Pch-FET 352 where the source terminal of Pch-FET 351 connects to the high system voltage Vdd on line 350, the gate terminal of Pch-FET 351 connects to enable line 319, the drain terminal of Pch-FET 351 connects to the source terminal of Pch-FET 352, the gate terminal of Pch-FET 352 connects to control line 310 and the drain terminal of Pch-FET 352 connects to line 307 and the load block.

When the voltage on enable line 319 is Vdd, Pch-FET 351 is put in a nonconductive state and no current can flow through Pch-FET 351, and Pch-FET 352, to the load block. When the voltage on the enable line is Vss, Pch-FET 351 is set to its minimum impedance (tunred-on) state. With Pch-FET 351 in its minimum impedance state current can flow through Pch-FET 351 and Pch-FET 352, to the load block. Then the voltage between the source of Pch-FET 352 and control line 310 (the gate of Pch-FET 352) along with channel width and length of Pch-FET 352 determines the magnitude of the current flowing through Pch-FET 351 and Pch-FET 352 to the load block.

In the circuit of FIG. 3, current mirror 306 has the gate of upper Pch-FET 353 permanently connected to Vss so that Pch-FET 353 is conducting all the time and current mirror 306 is always providing a fixed multiple of the reference current to load block 313.

Current mirror 305 conducts current to the load block only when enable line 319 is at voltage Vss. Current mirror 304 conducts current to the load block when enable lines 325 and 318 are at Vss, and is nonconductive when enable lines 325, and 318 are at Vdd.

Current mirror 303 provides the current to the load block only when some or all of the enable lines 321, 324, 323, and 322 are at Vss, and provides no current to the load block when enable lines 321, 324, 323, and 322 are all at Vdd. Current mirror 302, and current mirror 301 are connected enable line pairs 320, 317, and 315, 316 respectively and function identically to current mirror 304 and its enable line pair 325,318.

Current mirror 302 provides, the current to the load block when lines 317 and 320 are both at voltage Vss. Current mirror 301 provides the current to the load block when one or both lines 315 and 320 are at voltage Vss.

The load block 313 in FIG. 3 comprises three components connected in series between line 307 and low system voltage Vss. This block is a replica of the output driver pull-up side. The three series connected components are resistor 391, connected from line 307 to the drain terminal of a first N-channel FET (Nch-FET), a first Nch-FET 392, which has its drain terminal connected to resistor 391 its gate terminal connected to Vdd and its source terminal connected to the drain terminal of a second Nch-FET, and second Nch-FET 393, which has its drain terminal connected to the source terminal of 392 its gate terminal connected to Vdd and its source terminal connected to Vss.

The connection of the gate terminals on Nch-FETs 392 and 393 to Vdd causes both of them to be in a minimum impedance (turned-on) state. In this minimum impedance state, both Nch-FETs 392 and 393 exhibit an impedance that is determined by the length and width of the FET conduction channel of each FET, and due to the series connection of Nch-FETs 392 and 393 and resistor 391 the impedance exhibited by the load block to any current flowing through it is the sum of the impedances of resistor 391, Nch-FET 392 and Nch-FET 393. Current flowing through the impedance of the control block to Vss develops the voltage on line 307.

Figure 4:
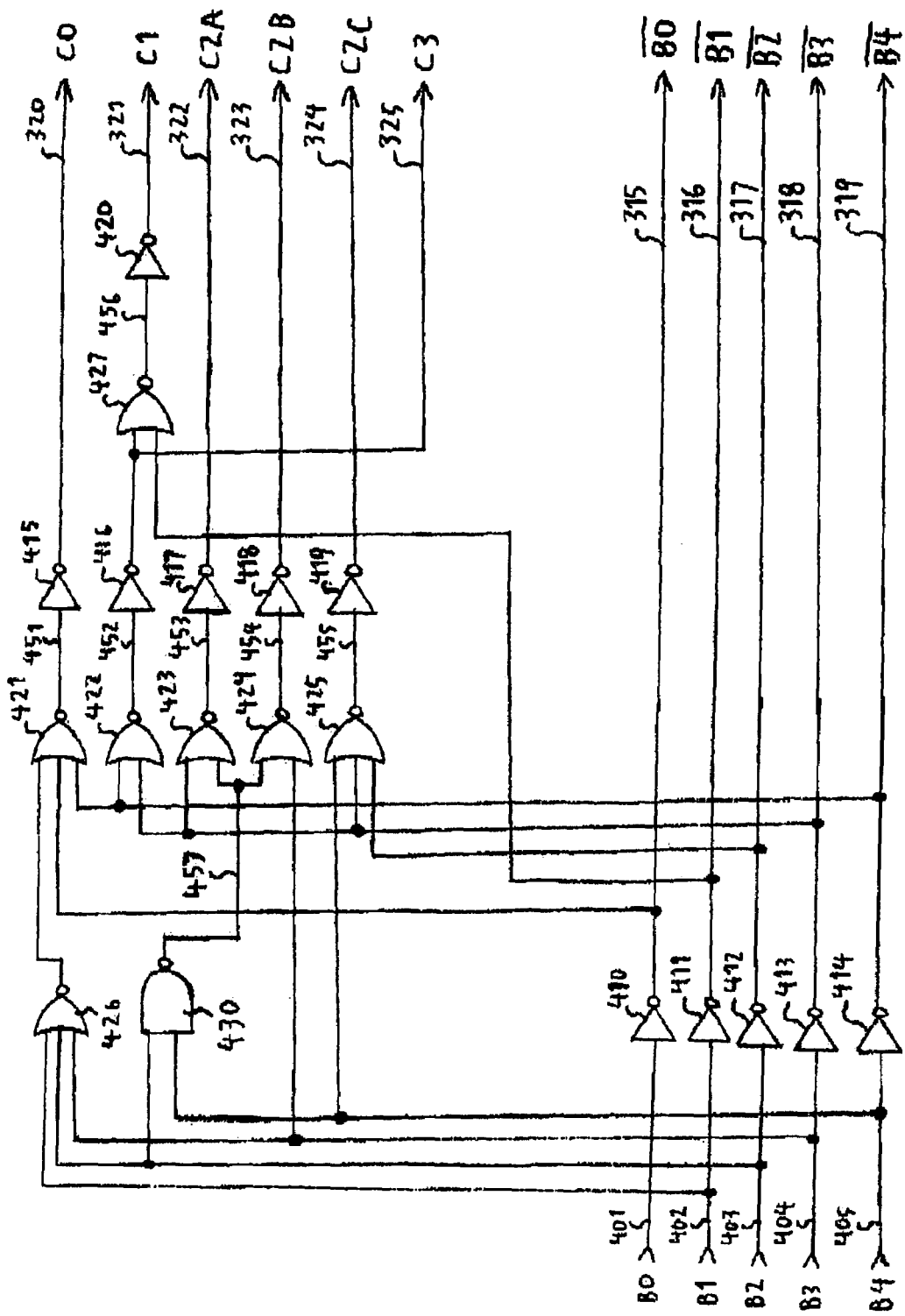
FIG. 4 is a schematic diagram of a current step adjustment controller for activating the current based impedance sensor of FIG. 3 in accordance with an aspect of the invention.

FIG. 4 shows a schematic diagram of the pull down side current step adjustment controller 303 of FIG. 3 The circuit of FIG. 4 generates a plurality of digital driver signals for generating the output voltage of the pull down current based impedance sensor 202 on line 206 in FIG. 2. The circuit uses logic inverters and gates to produce in this example, 11 digital driver signals from the five control signals B0, B1, B2, B3, B4 in FIG. 3.

The circuit contains, as a non-limiting example, five inverting gates 410, 411, 412, 413, 414, each of which has one input line and one output line. Each of gates 410 to 414 inverts logic levels received on the input line by producing a low voltage on the output line in response to a high voltage on the input line, and a high voltage on the output line in response to a low voltage on the input line. Gate 410 receives control signal B0 on input line 401, and inverts the logic levels to produce INVB0 on output line 315 which is used by other logic gates shown in FIG. 4 and circuitry in FIG. 3.

Gates 411, 412, 413, 414 receive control signals on input lines 402, 403, 404, 405, respectively and invert logic levels to produce signals INVB1, INVB2, INVB3, INVB4. Gate 411 receives B1 on input line 402 to produce INVB1 on output line 316.

Gate 412 receives B2 on input line 403 to produce INVB2 on output line 317. Gate 413 receives B3 on input line 404 to produce INVB3 on output line 318. Gate 414 receives B4 on input line 405 to produce INVB4 on output line 319. The outputs INVB0, INVB1, INVB2, INVB3, and INVB4 comprise four of the 11 digital driver signals for the circuitry of FIG. 3.

The remaining six digital driver signals, C0, C1, C2A, C2B, C2C, and C3 are produced by the interconnection of logic gates 415, 416, 417, 418, 419, 420, 421, 422, 423, 424, 425, 426, 427, and 430. The interconnection of logic gates has nine logic signals as inputs, which are B1, B2, B3, B4, INVB0, INVB1, INVB2, INVB3, and INVB4. The six digital driver signals C0, C1, C2A, C2B, C2C, and C3 appear on output lines 320, 321, 322, 323, and 324 respectively. Each one of the six driver signals is at a high logic voltage level for a certain number, X, of patterns of high and low logic voltage levels of control signals B0, B1, B2, B3, and B4, and at a low logic voltage level for a number, Y, of patterns of high and low logic voltage levels of the control signals where the sum of X and Y is the number of all possible patterns of high and low logic voltage levels of the control signals.

The values of numbers X and Y are unique to each one of the driver signals C0, C1, C2A, C2B, C2C, and C3. When all driver signals are combined into one computer word they activate unique combinations of FETs in the circuit of FIG. 3 to be turned on or off so that each pattern of high and low logic voltage levels of control signals B0 to B4 corresponds to a unique output voltage level on line 307 of FIG. 3 where said output voltage level can vary in discrete steps.

Figure 5:
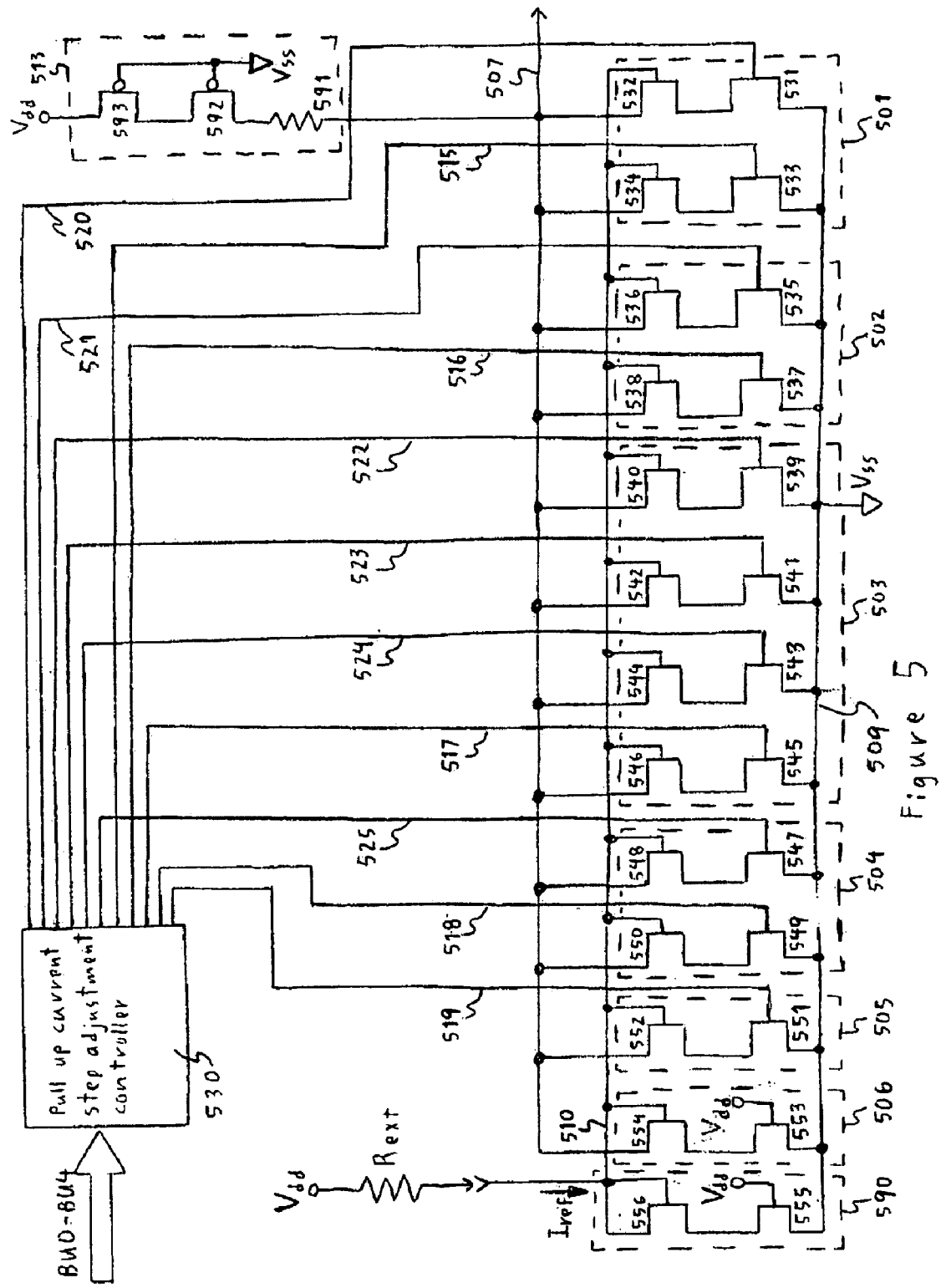
FIG. 5 s a schematic diagram of the pull-up current based impedance sensor shown in FIG. 2 in accordance with an aspect of the invention.

FIG. 5 shows the circuit of pull up current based impedance sensor 201 in FIG. 2. This circuit functions on the principle of a current-based digital-to-analog converter. The digital input controls the amount of current flowing through a replica of the output driver resistance section. Flow of this controlled current through the resistance generates analog voltage output on node 507. This voltage output is compared against a known voltage reference to generate the Lock signal feedback for the digital controller.

The circuit is comprised of one reference current generator 590, a parallel connected array of six digitally controlled current mirror groups, 506, 505, 504, 503, 502 and 501, one impedance block 513, and one pull down current step adjustment controller 530.

The reference current generator 590 has a first terminal connected to line 590 which is at low system voltage Vss, and a second terminal which is connected to control line 510. The reference current generator works on the principle of current mirror. An external circuit sources a reference current (Iref) into the node 510. This reference current is generated by applying a precise reference voltage across an external precision resistor (not shown in FIG. 5). Transistor 556 is a diode connected transistor that generate a mirror control voltage on control line 510 based on I ref as its drain current.

Each of the six digitally controlled current mirrors has a series switch transistor to turn the current on or off. The gate of these switch transistors are connected to digital outputs of step-adjustment controller 530 via enable lines 515, 516, 517, 518, 519, 520, 521, 522, 523, 524 and 525. Step adjustment controller 530 controls these current mirrors based on the digital input BU0–BU4 from digital controller. The step adjustment controller sets up digital signals on these enables lines to produce either no output current or an output current that is some multiple of the reference current in response to the logic voltage levels that appear on the enable lines.

The parallel-connected array of current mirrors is connected between the low system voltage Vss on line 509 and node 507. The impedance block 513 has a first terminal that is connected to node 507, and a second terminal that is connected to high system voltage Vdd, and is connected so that the sum of the output currents of all enabled current mirrors flows through the impedance block to generate an output voltage on node 507.

The enable lines are the outputs of the pull up current step adjustment controller which converts digital input on the bus BU0–BU4 to patterns of voltage Vdd (logic 1) and voltage Vss (logic 0) on the enable lines which activate none, all, or a portion of the six digitally controlled current mirror groups, and thereby makes the output voltage on node 507 adjustable to discrete values between two preset levels in response to a binary number on input bus BU0–BU4.

The reference current generator 590 comprises two N channel field effect transistors (Nch-FETs), 555 and 556, connected in series where the source terminal of Nch-FET 555 connects to the low system voltage Vss on line 509, the gate terminal of Nch-FET 555 connects to the high system voltage Vdd, the drain terminal of Nch-FET 555 connects to the source terminal of Nch-FET 556, and the drain and gate terminals of Nch-FET 556 connect together on control line

510. Nch-FET 556 is a diode connected transistor and acts as the current mirror voltage generator.

This series connection sets Nch-FET 555 to its minimum impedance (turned-on) state and allows reference current to flow through Nch-FET 555 and Nch-FET 556.

The reference current flows through diode connected Nch-FET 556. This diode connected transistor 556 acts like a Current to Voltage converter and converts the reference current to a voltage that is used as current mirror control voltage on node 510. This control voltage on node 510 sets the output current of each of a plurality of digitally controlled current mirrors. In this example six groups of current mirrors are shown (501, 502, 503, 504, 505, 506).

Each of the six groups of digitally controlled current mirrors 501–506 is comprised of one, two, or four parallel connected current mirror circuits, each of which functions the same way but which differ from each other in that the current drive capability of each current mirror is adjusted by proper designing of the width and the length of the FET conduction channel.

This in turn allows each parallel connected circuit within a digitally controlled current mirror to produce a predesigned multiple of the reference current when all upper Nch-FETs, 532,534, 536, 538, 540, 542, 544, 546, 548, 550, 552, 554, have their gate terminals connected together on control line 510.

The function of any of the parallel-connected circuits will be explained using digitally controlled current mirror 505, comprising lower Nch-FET 551, and upper Nch-FET 552, as an example.

Lower Nch-FET 551 is connected in series with upper Nch-FET 552 where the source terminal of Nch-FET 551 connects to the low system voltage Vss on line 509, the gate terminal of Nch-FET 551 connects to enable line 519, the drain terminal of Nch-FET 551 connects to the source terminal of Nch-FET 552, the gate terminal of Nch-FET 552 connects to control line 510 and the drain terminal of Nch-FET 552 connects to node 507 and the impedance block 513.

When the voltage on enable line 519 is Vss, Nch-FET 551 is put in a nonconductive state and no current can flow through Nch-FET 551, and Nch-FET 552 to the load block. When the voltage on the enable line is Vdd, Nch-FET 551 is set to its minimum impedance (turned-on) state. With Nch-FET 551 in its minimum impedance state current can flow through Nch-FET 551 and Nch-FET 552 to the impedance block 513. Then the voltage between the source of Nch-FET 552 and control line 510 (the gate of Nch-FET 552) along with channel width and length of Nch-FET 552 determines the magnitude of the current flowing through Nch-FET 551 and Nch-FET 552 to the impedance block 513.

In the circuit of FIG. 5 current mirror 506 has the gate of lower Nch-FET 553 permanently connected to Vdd so that Nch-FET 553 is conducting all the time and current mirror 506 is always providing 4 times the reference current to load block 513.

The load or impedance block 513 in FIG. 5 comprises three components connected in series between line 507 and high system voltage Vdd. This block is a replica of the output driver pull-up side. The three series connected components are: resistor 591, connected from line 507 to the drain terminal of a first P-channel FET (Pch-FET); a first Pch-FET 592, which has its drain terminal connected to resistor 591 its gate terminal connected to Vss and its source terminal connected to the drain terminal of a second Pch-FET; and a second Pch-FET 593, which has its drain terminal connected to the source terminal of 592 its gate terminal connected to Vss and its source terminal connected to Vdd.

The connection of the gate terminals on Pch-FETs 592 and 593 to Vss causes both Pch-FETs to be in a minimum impedance state. In this minimum impedance state, both Pch-FETs 592 and 593 exhibit an impedance that is determined by the length and width of the FET conduction channel of each FET. Due to the series connection of FETs 592 and 593 and resistor 591, the impedance exhibited by the load block to any current flowing through it is the sum of the impedances of resistor 591, Pch-FET 592, and Pch-FET 593. Current flowing through the impedance of the control block to Vdd develops the voltage on line 507.

Figure 6:
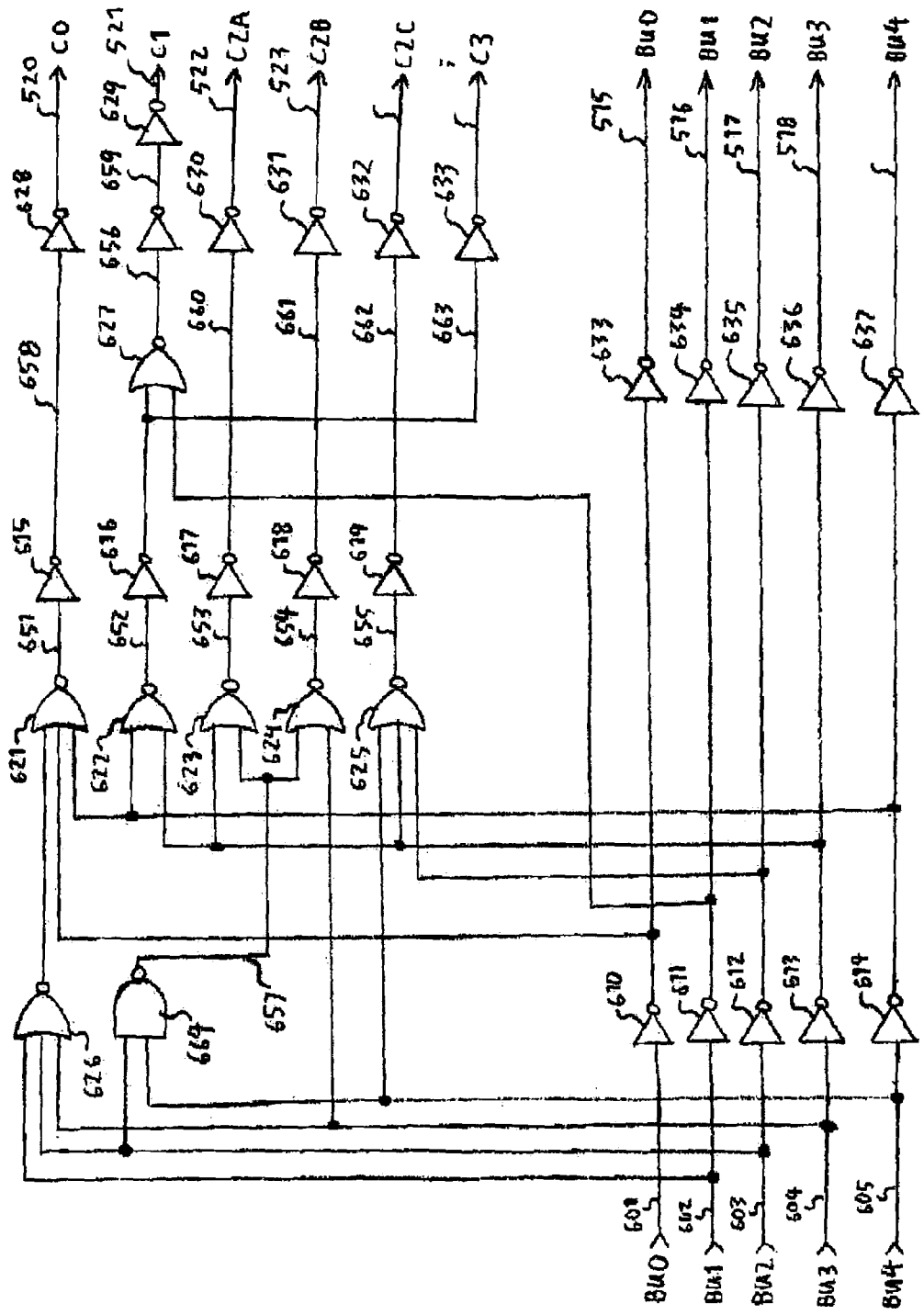
FIG. 6 is a schematic diagram of a current step adjustment controller for activating the pull-up based impedance sensor shown in FIG. 5 in accordance with an aspect of the invention.

FIG. 6 shows the schematic of the pull up side current step adjustment controller 530 in FIG. 5. The circuit generates 11 digital driver signals for generating the output voltage of the pull up current based impedance sensor 201 on line 205 in FIG. 2. The circuit uses logic inverters and gates to produce the 11 digital driver signals from the five current step control signals BU0, BU1, BU2, BU3, BU4 in FIG. 5.

The step adjustment controller circuits of FIGS. 4 and 6 for the pull down and pull up sides are designed to adjust a sum of scaled versions of the reference current in response to first control signals from the digital controller (in the pull up case, pull up control signals BU0–BU4). For each value of a first control signal that when applied to a second control signal to the output driver, results in output driver impedance equal to target impedance, the voltage drop across a replica resistance due to the sum of the scaled versions of the reference current is equal to a known, predetermined reference voltage.

The circuit contains five inverting buffers 610, 611, 612, 613, and 614, which receive current step control signals BU0, BU1, BU2, BU3, and BU4 respectively on one input line, and invert the received logic levels on an output line. Each of inverting buffers 610, 611, 612, 613, and 614 produces a low voltage on its output line in response to a high voltage on its input line, and a high voltage on its output line in response to a low voltage on its input line. Inverting buffer 610 receives current step control signal BU0 on input line 601, and inverts the logic levels to produce signal INVBU0 on its output line which is connected to other logic gates and inverting buffers shown in FIG. 6. Inverting buffers 611, 612, 613, and 614 operate in the same way as inverting buffer 610, receiving current step control signals BU1, BU2, BU3, and BU4, respectively on individual input lines 602, 603, 604, and 605, respectively to produce signals INVBU1, INVBU2, INVBU3, and INVBU4 on individual output lines which are connected to other logic gates and inverting buffers shown in FIG. 6.

Logic gates 621, 622, 623, 624, 625, 626, 627, 638, and corresponding inverting buffers 615, 616, 617, 618, 619, 620 are interconnected to form a logic block which receives BU1, BU2, BU3, BU4, INVBU0, INVBU1, INVBU2, INVBU3, and INVBU4 as inputs and produces six logic signals that appear on lines 656, 658, 660, 661, 662, and 663.

Each one of the six logic signals is at a high logic voltage level for a certain number, X, of patterns of high and low logic voltage levels of step current control signals B0, B1, B2, B3, and B4, and at a low logic voltage level for a number, Y, of patterns of high and low logic voltage levels of the step current control signals where the sum of X and Y is the number of all possible patterns of high and low logic voltage levels of the current step control signals.

The values of numbers X and Y are unique to each one of the logic signals on lines 656, 658, 660, 661, 662, and 663.

This means that the logic signal on any one of lines 656, 658, 660, 661, 662, and 663 is at a high voltage only for certain binary numbers that appear on lines 601, 602, 603, 604, and 605 encoded as patterns of high voltage levels (logic 1) and low voltage levels (logic 0), and at a low voltage level for all other binary numbers.

Inverting buffers 628, 629, 630 631, and 632, receive the logic signals on lines 656, 658, 660, 661, 662, and 663 respectively as inputs and invert the input logic levels in the same way as inverting buffer 610 does to produce digital driver signals C0, C1, C2A, C2B, C2C, and C3 as outputs. Inverting buffers 633, 634, 635, 636, and 637 receive the signals INVBU0, INVBU1, INVBU2, INVBU3, and INVBU4 respectively and invert the logic levels to produce digital driver signals BU0, BU1, BU2, BU3, and BU4 as outputs.

Digital driver signals BU0, BU1, BU2, BU3, BU4, C0, C1, C2A, C2B, C2C, and C3 are combined into a logic signal which is used to turn on or off various combinations of the FETs 531, 533, 535, 537, 539, 541, 543, 545, 547, 549, and 551, in the circuit of FIG. 5. In this way, each pattern of high and low logic voltage levels of current step control signals BU0, BU1, BU2, BU3, and BU4 corresponds to a unique output voltage level on line 507 of FIG. 5. That output voltage level can vary in discrete steps determined by Iref of FIG. 5 and a replica circuit.

Figure 7:
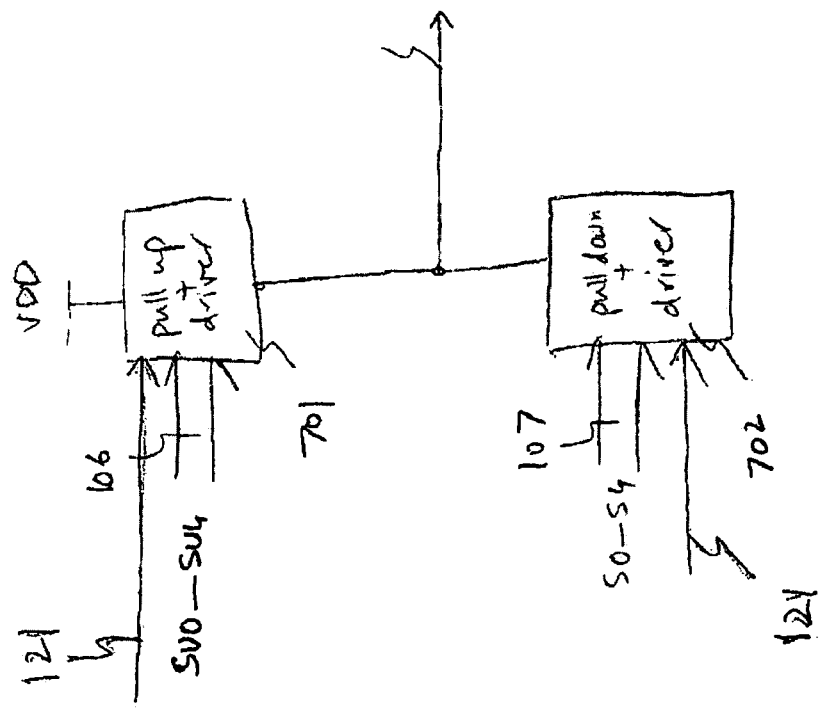
FIG. 7 is a block diagram of the pull-up driver and pull-down driver comprising the output block of FIG. 1 in accordance with an aspect of the invention.

FIG. 7 shows a block diagram of the impedance line driver. The impedance line driver comprises an adjustable impedance pull up driver 701, and adjustable impedance pull down driver 702. The adjustable impedance pull up driver 701 has a first main terminal connected to high system voltage Vdd and a second main terminal connected to data transmission line 110 and to a first main terminal of adjustable impedance pull down driver 702. The adjustable impedance pull down driver 702 has a first main terminal connected to data transmission line 110 and a second main terminal connected to low system voltage Vss. The adjustable impedance pull up driver has a data input line 121 and five impedance control lines SU0, SU1, SU2, SU3, and SU4 for this example. The impedance control lines can be less than or more than 5 bit width depending upon the application. Data input line 121 enables the adjustable impedance pull up driver and allows current to flow through the adjustable impedance pull up driver main terminals, into line 110, and then through an external receiver load connected from line 110 to system ground, thus making the voltage on line 110 high (logic 1).

The five impedance control lines comprise a circuit means for sending binary numbers into the adjustable impedance pull up driver to set the impedance of the adjustable impedance pull up driver. The adjustable impedance pull down driver also has a data input line 122 and five impedance control lines S0, S1, S2, S3, and S4 for this example. The impedance control lines can be less than or more than 5 bit width depending upon the application. Data input line 122 enables the adjustable impedance pull down driver and allows current to flow through the receiver load connected to system ground, into line 110, then through the adjustable impedance pull down driver main terminals, thus making the voltage on line 110 low (logic 0).

The impedance control lines also comprise a circuit means for sending binary numbers into the adjustable impedance pull down driver to set the impedance of the adjustable impedance pull down driver.

Figure 8:
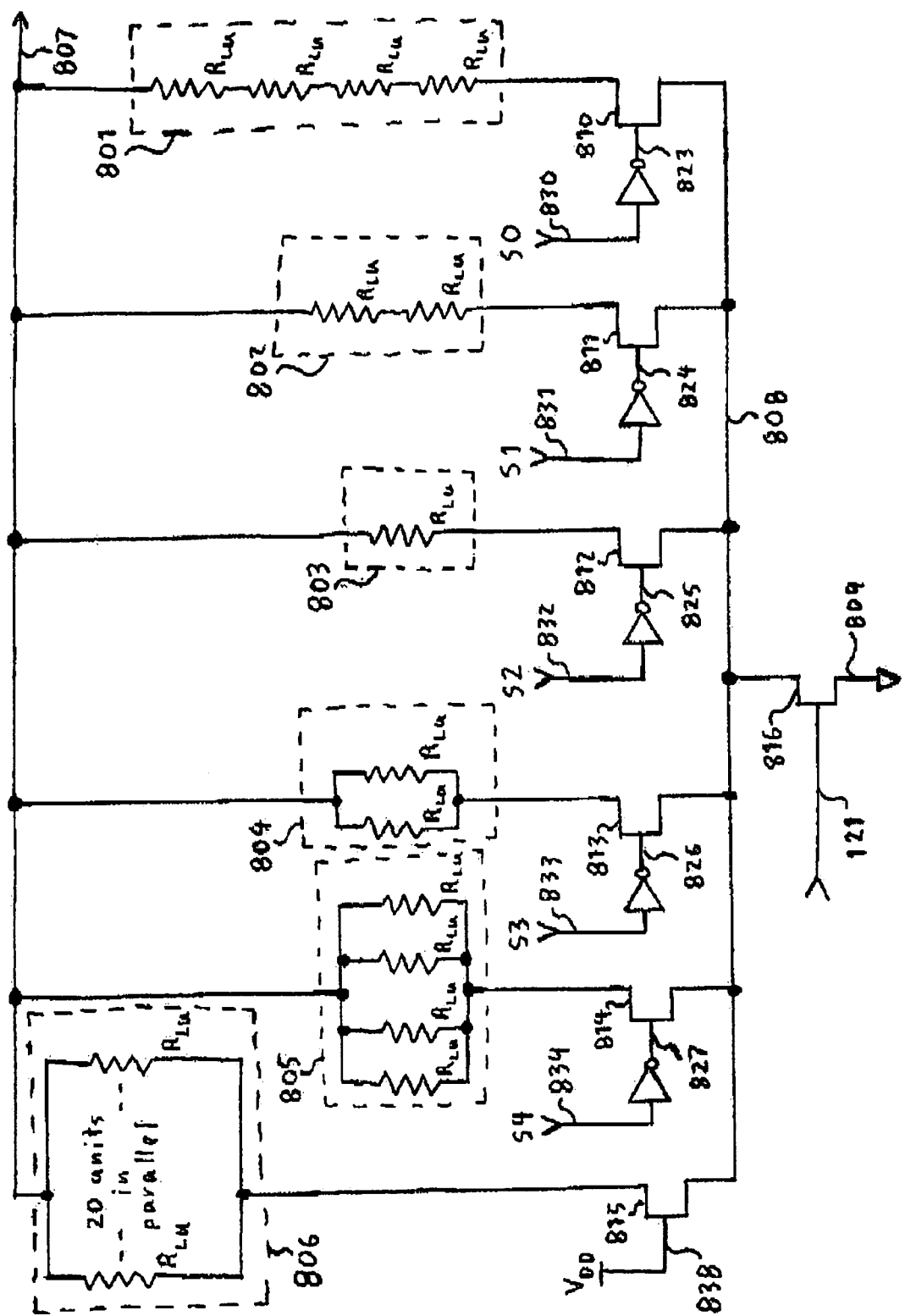
FIG. 8 is a schematic diagram of the pull-down driver shown in FIG. 7 in accordance with an aspect of the invention.
Figure 9:
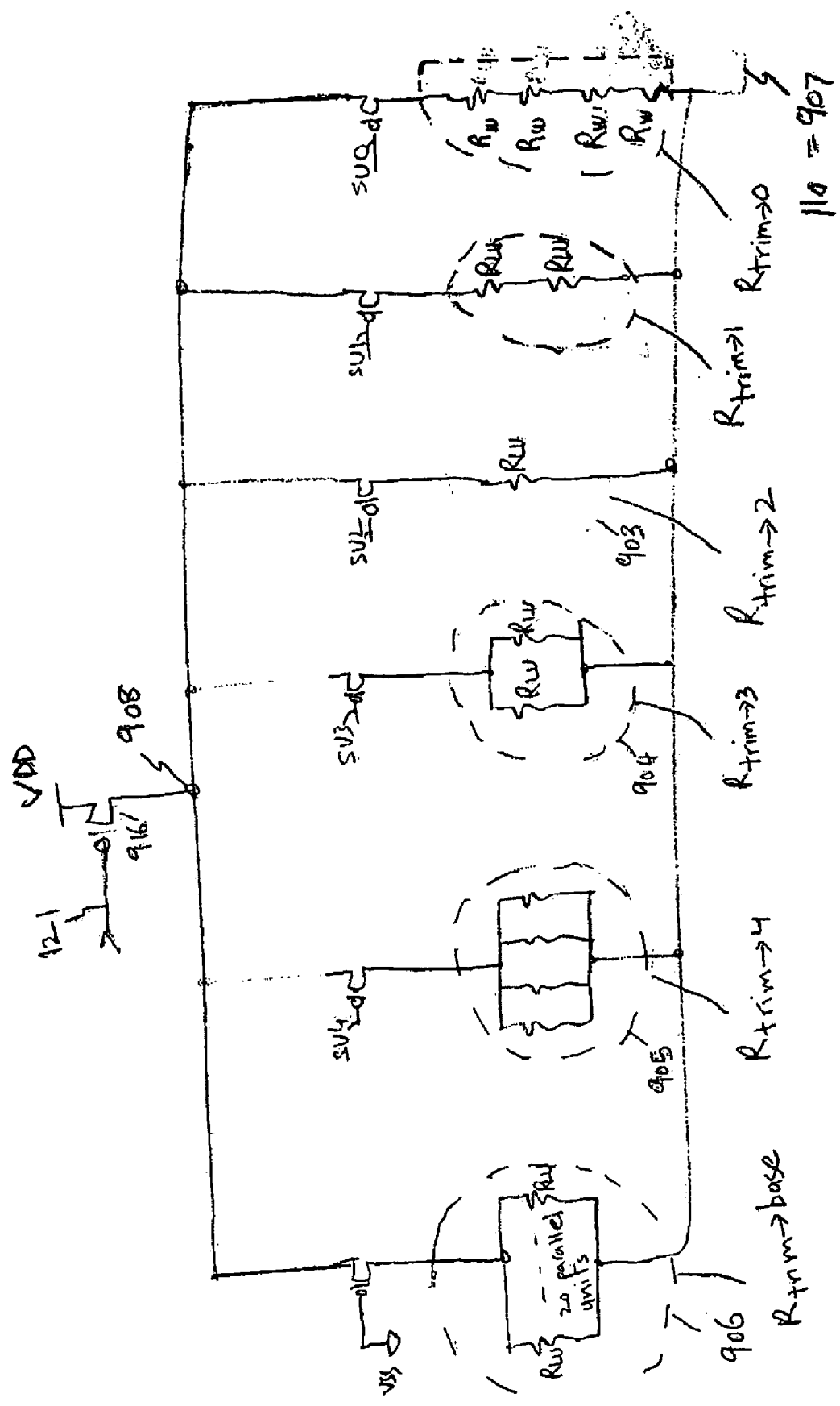

FIG. 8 shows the circuit of the pull down line driver of 702 in FIG. 7. The pull down line driver is composed of a plurality of parallel circuits (in this non limiting example there are six parallel circuits) connected between line 808 and line 807. Each of the parallel circuits comprises a series connection of an N channel FET (Nch-FET) and a resistor block. The Nch-FETs in the parallel-connected circuits are 810, 811, 812, 813, 814, and 815. Nch-FET 815 has a source terminal connected to line 808, a gate terminal connected to high system voltage Vdd, and a drain terminal connected to a first terminal of resistor block 806. A second terminal of resistor block 806 connects to line 807. The Nch-FETs 810, 811, 812, 813 and 814 have their source terminals connected to line 808, their gate terminals connected to the output lines of five control inverters 823, 824, 825, 826, and 827 respectively, and their drain terminals connected to first terminals of resistor blocks 801, 802, 803, 804, and 805, respectively. The second terminals of resistor blocks 801, 802, 803, 804, and 805, respectively, connect to line 807. Nch-FET 809 is connected between low system voltage Vss and line 808, with source terminal connected to Vss, gate terminal connected to data input line 121, and drain terminal connected to line 808. The five control inverters 823, 824, 825, 826, and 827 have their input terminals connected to corresponding input control lines S0, S1, S2, S3, and S4 respectively, and invert the logic level of voltages that appear on the input control lines. That is, the control inverters produce low system voltage Vss in response to high system voltage Vdd on the input, and they produce high system voltage Vdd in response to low system voltage Vss on the input.

In FIG. 8, Nch-FET 815 is always conducting current since its gate is connected to Vdd. The magnitude of this branch current is set by the value of series connected resistor block 806, that is composed of a number of parallel connected resistors. The values of parallel connected resistors in resistor block 806 are such that the effective resistance of resistor block 806, and the pull down line driver is near or equal to target resistance/impedance when the resistor manufacturing process results in the lowest guaranteed resistance. in this case (lowest guaranteed resistance) Nch-FET 815 and 816 are the only FETs conducting.

In the remaining parallel-connected circuits, Nch-FET 814 conducts only when line S4 is at Vss, Nch-FET 813 conducts only when line S3 is at Vss, Nch-FET 812 conducts only when line S2 is at Vss, Nch-FET 811 conducts only when line S1 is at Vss, and Nch-FET 810 conducts only when line S0 is at Vss. The Nch-FETs 810, 811, 812, 813, and 814, operate as switches to connect a desired combination of corresponding resistor blocks 801, 802, 803, 804, and 805 in parallel with resistor block 806, and thereby decrease the effective resistance of the pull down line driver. Each of the resistor blocks 801, 802, 803, 804, 805, is set to a different value of resistance such that the effective resistance of the pull down line driver can be set in desired increments. For example, resistor manufacturing processes typically can result in +/−25% variation in manufactured resistance. In an aspect of the invention, this circuit compensates for the entire resistance variation range by switching in or out a portion or all of parallel 32 resistance increments. Thus, the entire manufacturing range of variations is divided into, for example, 32 increments of the value of resistor block 906. The value of equivalent resistance looking into node 809 can be set by second control signals on impedance control lines S4, S3, S2, S1, and S0. This selective connecting of resistor blocks in parallel thereby enables the pull down line driver to achieve a predetermined optimal impedance.

Each of Nch-FETs 810, 811, 812, 813, 814, 815, is set to a nonconductive state whenever the gate terminal is at low system voltage Vss. And, each Nch-FET is set to a conducting state whenever the gate terminal is at high system voltage Vdd. Nch-FET 809 is set to a nonconductive state whenever data input line 122 (the gate of Nch-FET 809) is at low system voltage Vss. Nch-FET 809 is set to a conducting state whenever data input line 122 is at high system voltage Vdd. Current flows through the pull down line driver from line 807 to Vss only when impedance control line 122 is at Vdd and one or more of the gate terminals of Nch-FETs 810, 811, 812, 813, 814, 815 is at Vdd. Then the current flowing from line 807 to Vss is the sum of the branch currents flowing in those parallel-connected circuits having a conducting Nch-FET. The current then flows into line 807 from a data output line shown by line 110 in FIG. 7 which connects to the external receiver load.

The design of FIG. 8 is such that the total dynamic range of the possible resistance variation is divided into $2^{\#bits}$. The #bits is chosen for a particular application based on required accuracy. For this example we have used 5 bits. Therefore, the total dynamic range of resistance variation is divided in 32 sections. For minimum value of resistance variation, this impedance matching system results in output resistance equal to an abstracted base-resistor which is designed to give output target resistance for this particular case. For maximum value of resistance variation, this impedance matching system results in output resistance equal to an abstracted base-resistor in parallel with 32 parallel abstracted unit-resistors. This parallel combination of base-resistor and 32 parallel unit-resistors is designed to give output target resistance for the maximum value of resistance variation. Refer to the Design Guide for detailed mathematical treatment of this design.

Figure 9:
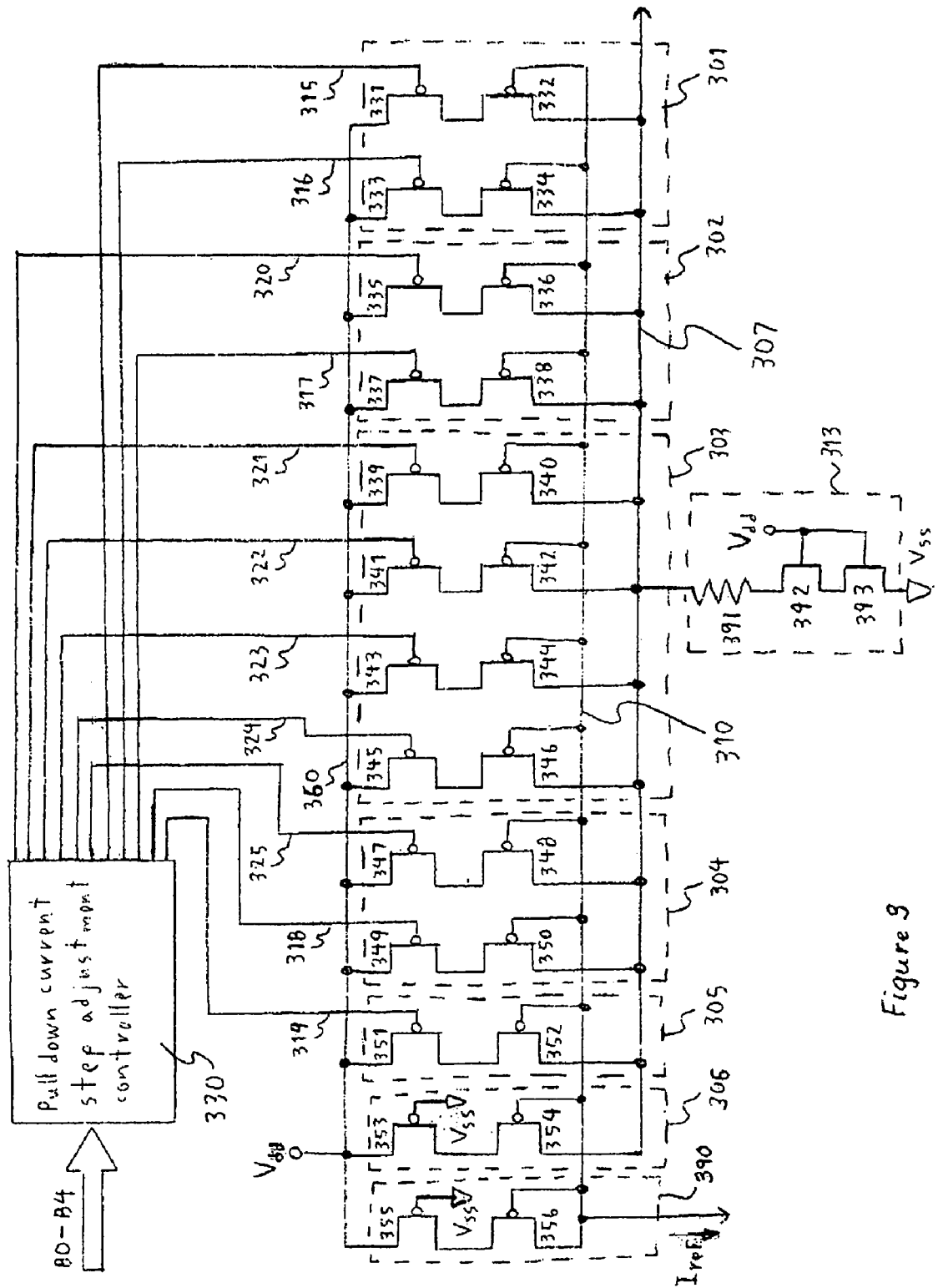
FIG. 9 is a schematic diagram of the pull-up driver shown in FIG. 7 in accordance with an aspect of the invention.

FIG. 9 shows the circuit of the pull up line driver of 701 in FIG. 7. The pull up line driver is composed of six parallel circuits connected between line 907 and line 908. Each of the six circuits comprises a series connection of a P channel (Pch) FET and a resistor block. The Pch FETs in the six parallel-connected circuits are 910, 911, 912, 913, 914, 915. Pch FET 915 has a source terminal connected to line 908, a gate terminal connected to low system voltage Vss, and a drain terminal connected to a first terminal of resistor block 906. A second terminal of resistor block 906 connects to line 907. The Pch-FETs 910, 911, 912, 913, 914 have their source terminals connected to line 908, their gate terminals connected to the five impedance control lines SU0, SU1, SU2, SU3, and SU4 respectively, and their drain terminals connected to first terminals of resistor blocks 901, 902, 903, 904, and 905, respectively. The second terminals of resistor blocks 901, 902, 903, 904, and 905 all connect to line 907. Pch-FET 909 is connected between high system voltage Vdd and line 908, with source terminal connected to Vdd, gate terminal connected to data input line 121, and drain terminal connected to line 908.

Each of Pch-FETs 910, 911, 912, 913, 914, and 915 is set to a nonconductive state whenever the gate terminal is at high system voltage Vdd, and each is set to a conducting state whenever the gate terminal is at low system voltage Vss. Pch-FET 909 is set to a nonconductive state whenever data input line 121 (the gate of Pch-FET 909) is at high system voltage Vdd, and Pch-909 is set to a conducting state whenever data input line 121 is at low system voltage Vss. Current flows through the pull up line driver from Vdd to line 907 only when impedance control line 121 is at Vss and one or more of the gate terminals of Pch-FETs 910 through 915 is at Vss. Then the current flowing from Vdd to line 907 is the sum of the branch currents flowing in those parallel-connected circuits having a conducting Pch-FET. The current then flows from line 907 to a data output line shown by line 110 in FIG. 7 which connects to the external receiver load.

In FIG. 9, Pch-FET 915 is always conducting current since its gate is connected to Vss. The magnitude of this branch current is set by the value of series connected resistor block 906 that is comprised of a plurality of parallel connected resistors. The values of parallel connected resistors in resistor block 906 are such that the effective resistance of resistor block 906, and the pull up line driver is near or equal to target resistance/impedance when the resistor manufacturing process results in the lowest guaranteed resistance. In this case (lowest guaranteed resistance) Nch-FET 915 and 916 are the only FETs conducting.

In the remaining parallel connected circuits, Pch-FET 914 conducts only when line SU4 is at Vss, Pch-FET 913 conducts only when line SU3 is at Vss, Pch-FET 912 conducts only when line SU2 is at Vss, Pch-FET 911 conducts only when line SU1 is at Vss, and Pch-FET 910 conducts only when line SU0 is at Vss. Each of Pch-FETs 910, 911, 912, 913, and 914 operate as a switch to connect resistor blocks 901, 902, 903, 904, and 905, respectively, in parallel with resistor block 906, and thereby decrease the effective resistance of the pull up line driver.

Each of the resistor blocks 901 through 905 is set to a different value of resistance so that the effective resistance of the pull up line driver can be set in desired increments. For example, a resistor manufacturing processes typically can result in +/−25% variation in manufactured resistance. An aspect of the invention compensates for the entire resistance variation range by switching in or out a portion or all of 32 parallel resistance increments. The entire manufacturing range of variations is divided into, for example, 32 increments of the value of resistor block 906. The value of equivalent resistance looking into node 907 can be set by for example second control signals, which in this case is a 5 bit binary number on impedance control lines S4, S3, S2, S1, and S0. This selective connecting of resistor blocks in parallel thereby enables the pull down line driver to achieve a predetermined optimal impedance.

Figure 10:
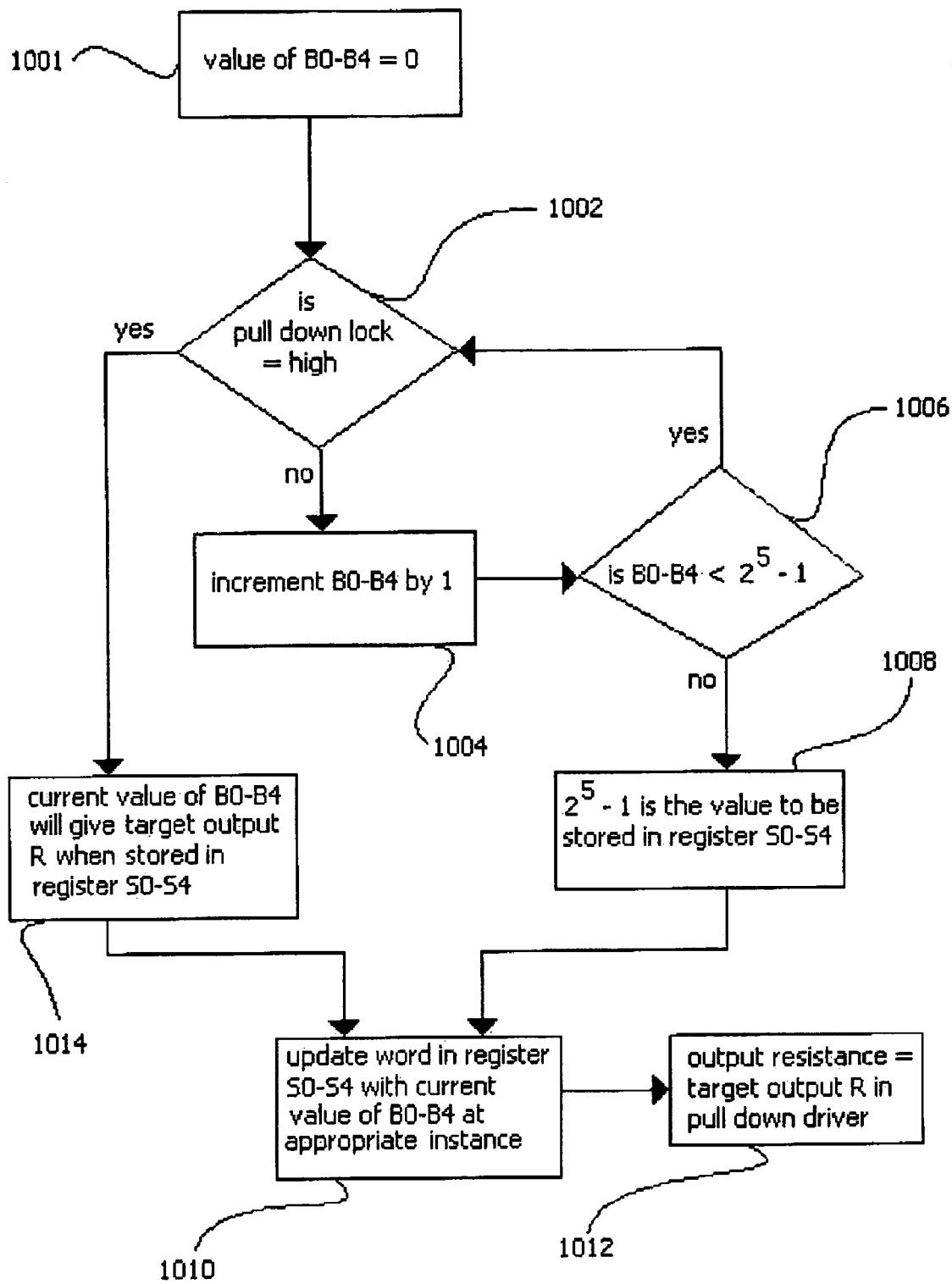
FIG. 10 is a flow chart of the system for providing pull-down control signals to the output block that optimizes impedance as shown in FIG. 1 in accordance with an aspect of the invention.

FIG. 10 shows a flow chart for setting impedance control signals to produce a target pull down resistance in the output block.

Block 1001 stores binary number 0 in control bits B0–B4 and sends the initial binary number to the control sense block to be tested. At 1002, the test asks if the pull down lock voltage is high (logic one). If it is, the binary number stored in control bits B0–B4 is transferred to impedance control bits S0–S4 at 1014. The current value of B0–B4 will give the target output impedance.

At 1010, the binary number stored in impedance control bits S0–S4 is sent to the output block. At 1012, the output block receives the value of binary number in the impedance control bits S0–S4 and produces the target pull down resistance.

If the pull down lock voltage is low (logic zero), at 1002, the search process continues at 1004 by adding one to the binary number stored in control bits B0–B4 to form the current value of the binary number that is tested at 1006.

Block 1006 tests between the incremented value of the binary number stored in control bits B0–B4 and the interpretation of the test results for the current value of the binary number. If the new binary number is less than binary 11111 (decimal 31), the search process continues and the value of B0–B4 is tested again at 1002.

At 1006, if the new binary number has reached a value of binary 11111 during the search process then the search process stops, and the binary number 11111 is transferred to impedance control bits S0–S4 at 1008. With reference to FIG. 1, the binary number in impedance control bits S0–S4 is sent to control block 103 where it produces the target pull down resistance.

Figure 11:
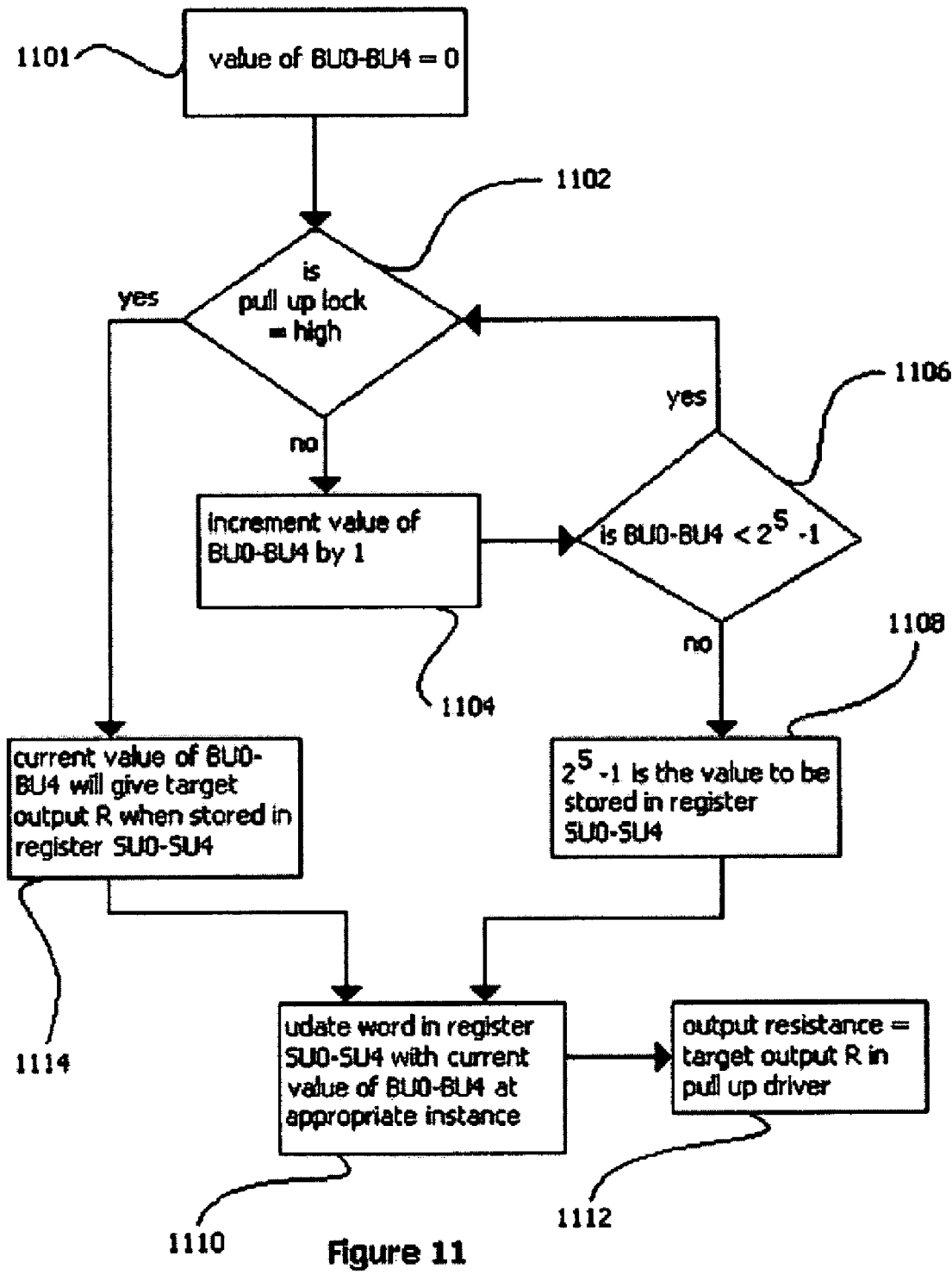
FIG. 11 is a flow chart of the system for determining pull-up control signals to the output block that optimize impedance as shown in FIG. 1 in accordance with an aspect of the invention.

FIG. 11 shows a flow chart for the pull up side of the digital controller as it searches to set impedance control signals that provide a target pull up resistance. The steps are similar to those performed as explained with reference to FIG. 10 (the pull down side).

1101 shows the generation of the initial binary number stored in five control bits labeled BU0–BU4. The five control bits are sent by second controller output port 105 to control sense block 102 in FIG. 1 to test the initial binary number with respect to a target resistance in output block 103. The digital controller takes one of two possible actions.

If the pull up lock voltage is high (logic one), the current value of BU0–BU4 is transferred to register SU0–SU4 and provides the target output resistance.

If the pull up lock voltage is low (logic zero), the digital controller continues the search by adding one to the current binary number stored in the control bits BU0–BU4, and sends the sum to the control sense block at 1106. In this way the binary number that was initially stored in control bits BU0–BU4 at 1101 is incremented by one and tested until a number is found that will produce the target pull up resistance in the output block, and that new number is sent to the output block.

At 1106 BU0–BU4 is tested. If the new binary number is greater than a value of binary 11111 during the search process, then at 1108 the search process stops, the binary number 11111 is transferred to impedance control bits register SU0–SU4. At 1110 the binary number in impedance control bits register SU0–SU4 is sent to control block 103. And at 1112, the output resistance is equal to the target output resistance in the pull up driver.

Referring to FIG. 12, the upper graph comprises voltage axis 1201 and binary number axis 1202. Binary number axis 1202 shows all possible values of binary numbers that can be stored in control bits B0–B4 arranged in ascending value along a horizontal axis. The control bits B0–B4 are inputs to pull down current based impedance sensor 202 in FIG. 2, and are sent to the pull down current based impedance sensor by input bus 204 in FIG. 2. As set forth previously, control bits also can be represented by Q bits, such as in quantum computation. Voltage axis 1201 indicates the direction of increasing impedance sensor output voltage. Rising step function 1204, of which only three sections are shown, is used in conjunction with voltage axis 1201 to show the correlation between a binary number input to pull down current based impedance sensor 202 in FIG. 2, and the output voltage of the pull down current based impedance sensor on line 206 in FIG. 2. Binary number 0 corresponds to the lowest step of function 1204. An input of the binary equivalent of 1 causes a jump to the next higher step, so that binary 1 corresponds to the next lowest step of function 1204. An input of the binary equivalent of 2 causes a jump to the next higher step such that 2 corresponds to the third lowest step of function 1204. This process is continued until there are 32 steps or levels and 31 jumps of function 1204. Each step of function 1204 is a discrete level of output voltage between a minimum level and a maximum level. Each jump of function 1204 is a voltage change caused by a change in the binary number input to the pull down current based impedance sensor.

A horizontal line 1203 is included in the top graph of FIG. 12. It is parallel to binary number axis 1202 and intersects rising step function 1204 at point 1205. Horizontal line 1203 represents the pull down reference voltage on line 208, whose magnitude is between the minimum level and the maximum level of the rising step function 1204.

The top graph of FIG. 12 shows how the sequence of binary numbers equivalent to decimal numbers 0, 1, 2, . . . , 31 can be generated by the digital controller 101 in FIG. 1, and converted to a corresponding output voltage by the pull down current based impedance sensor. It also shows how comparator 211 in FIG. 2 is used to detect a condition wherein the output voltage is less than the pull down reference voltage and when the output voltage is greater than the pull down reference voltage. The first instant when the output voltage becomes greater than the pull down reference voltage occurs at intersection point 1205 when binary number x is sent to the current based impedance sensor and causes a voltage change. Immediately after intersection point 1205 the comparator signals the digital controller to stop generating binary numbers and to transfer binary number x from control bits B0–B4 to impedance control bits S0–S4.

The bottom graph in FIG. 12 comprises binary number axis 1207, and resistance axis 1206. Binary number axis 1207 shows all possible values of binary numbers that can be stored in control bits S0–S4 arranged in ascending value along a horizontal line. The impedance control bits S0–S4 are inputs to pull down driver 702 in FIG. 7, and are sent to the pull down driver by input bus 107 in FIG. 7. Resistance axis 1206 indicates the direction of increasing resistance of the pull down driver. Rising step function 1209, of which only three sections are shown, is used in conjunction with resistance axis 1206 to show the correlation between a binary number input to pull down driver 702 in FIG. 7, and its resistance. Binary number 0 corresponds to the lowest step of function 1209. An input of the binary equivalent of 1 causes a jump to the next higher step so that binary 1 corresponds to the next lowest step of function 1209. An input of the binary equivalent of 2 causes a jump to the next higher step so that binary 2 corresponds to the third lowest step of function 1209. This process is continued until there are 32 steps or levels and 31 jumps of function 1209. Each step of function 1209 is a discrete level of output resistance between a minimum level and a maximum level. Each jump of function 1209 is a resistance change caused by a change in the binary number input to the pull down driver. As is known to one skilled in the art, additional or fewer steps or levels can be implemented.

A horizontal line 1208 is included in the top graph of FIG. 12. It is parallel to binary number axis 1207 and intersects rising step function 1209 at point 1210. Horizontal line 1208 represents the target resistance in the pull down driver which is equal to the resistance of a receiver load connected to output line 110 in FIG. 7. The magnitude of the target resistance is between the minimum level and the maximum level of the rising step function 1209. The step just to the right of intersection point 1210 is the resistance level of the pull down driver when binary number x is sent from impedance control bits S0–S4 to the pull down driver. The value of x is the same value that caused the digital controller to stop generating binary numbers and sending them to the pull down current based impedance sensor. The value of x can be seen from the graph to set the output voltage of the pull down current based impedance sensor to a level slightly higher than the pull down reference voltage and produce an output resistance in the output driver that approximates the target resistance.

Figure 13:
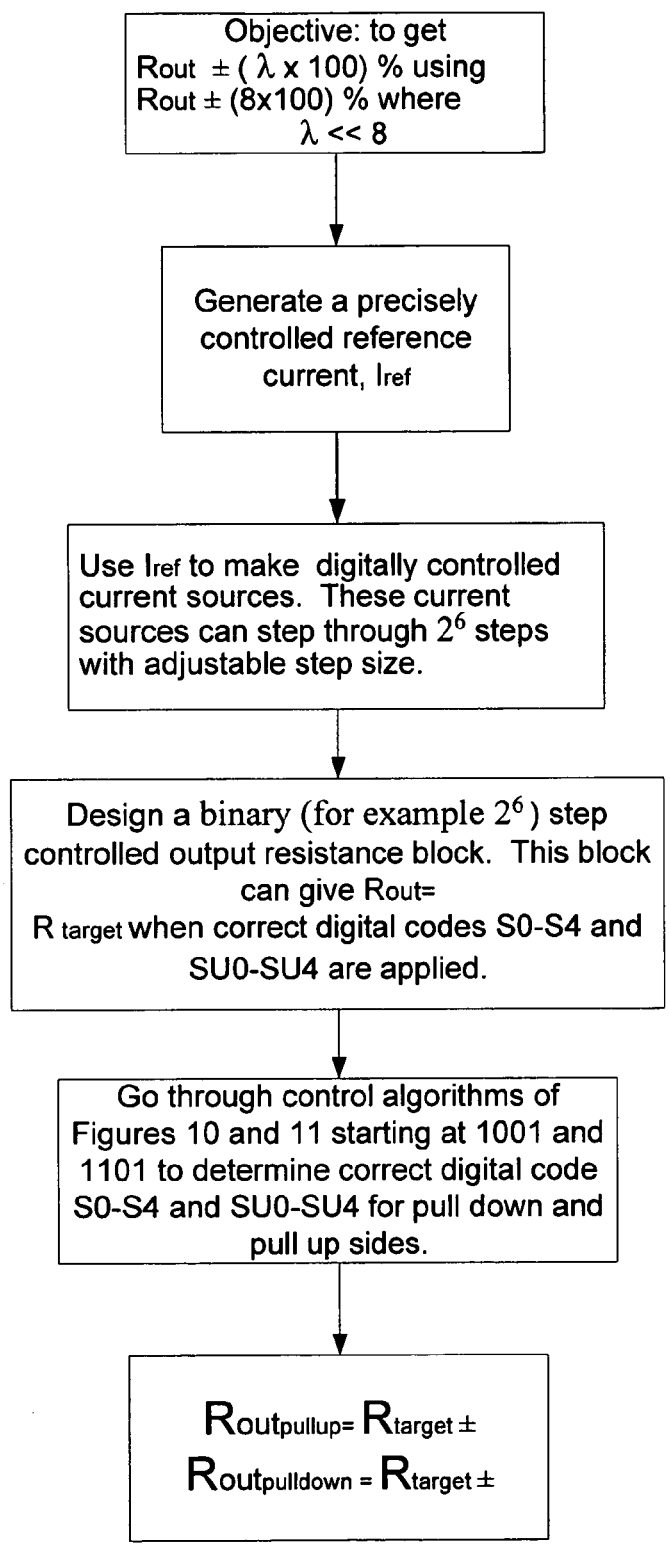
FIG. 13 is a block diagram showing logic flow for the overall process of impedance matching in accordance with an aspect of the invention.

FIG. 13 is a flowchart for the overall system for matching impedance in accordance with an aspect of the invention and is self-explanatory.

Output Driver Details

In accordance with an aspect of the invention shown in FIGS. 1–12, and in particular with reference to FIGS. 8 and 9, Output Resistor Design is as follows:

The output resistance section consists of parallel sections of resistors. The sections are then connected in series with switching transistors and driver transistors. The switching transistors are designed to have negligible impedance. However, a driver transistor may contribute significant impedance. The impedance of the driver driver transistor should be a very small portion of the total output resistance. The main component of the output resistance comes from the parallel resistor elements (801, 802, 803, 804, 805, 806 for pull down driver). This method can also be used in applications where a driver transistor is not needed.

The parallel sections consist of a Base Resistor ($R_{trim \to base}$) (806 in FIG. 8, 906 in FIG. 9) that is never switched out for trimming purposes. The other parallel sections have binary weighted trimming resistors that are switched in and out by b number of digital control bits. A digital controller 101 as shown in FIG. 1 controls each bit. Resistors in these sections are referred to as $R_{trim \to 0}$ (801) through $R_{Trim \to (b-1)}$ (805). On chip, these resistors can be made of sheet resistors or diffused resistors depending on the application. In recent technologies sheet resistors offer a number of advantages that include good thermal and voltage coefficient, low parasitic capacitance, good models and isolation from the substrate.

Output Driver Design Guide

The following is a general design guide that outlines design of these resistors

For $\pm(\delta \times 100)\%$ variation in Nominal Resistor Value

The trim resistor pull up/pull down consists of conceptual parallel units of nominal value $R_c$.

There will be $2^b$ parallel resistor units when $R_c$ is used to trim down the resistor value. Where b is the number of control bits The target value for pull up/down including resistors and drivers=$R_{out}$ Ohm The average driver resistance value≈$R_{drive}$ Ohms.

Variation in $R_{drive}$ will contribute to overall variation in $R_{out}$. However if $R_{drive}$ is a small portion of $R_{out}$ then the effect of this variation is small. The variation that this scheme controls is the variation in $R_t$.

The target trimmed resistor value=$R_{out} - R_{drive} = R_t$ Ohm

The target variation in $R_t$ is $\pm(\lambda \times 100)$ whereas $\lambda \leq \delta$ For example: for $\pm 20\%$ variation in nominal resistor value, delta=0.2 and lambda=0.05

We choose $$\frac{2 \times \delta}{2^b} \leq \lambda$$

This means that we divide total Resistance variation $2 \times \delta$ in $2^b$ equal partitions. And the partition or "chunk" size is chosen to be significantly smaller than the target variation $2 \times \lambda$. This is how we chose the value for b (Design step 1)

For $-(\delta \times 100)$ Per cent Case

For $-(\delta \times 100)$ per cent case, all the parallel trim resistors will be off and only the base resistor will be on. Assume that a base resistor is made of X parallel unit resistors $R_c$.

$$\frac{(1-\delta) \times R_c}{x} = R_t \Omega \qquad (I)$$

Nominal Case

For a nominal case. Assume there are total y parallel unit resistors $$\frac{1 \times R_c}{y} = R_t \Omega \qquad (II)$$

For $+(\delta \times 100)\%$ case, all $x + 2^b$ parallel trim resistors will be in parallel $$\frac{(1-\delta) \times R_c}{x + 2^b} = R_t \Omega \qquad (III)$$

From I, II & III above, the following relationships are derived $$\text{Number of parallel } R_c \text{ units in base (untrimmed) resistor} = x = \left(\frac{1-\delta}{\delta}\right) \times 2^{(b-1)} \qquad \text{(Design step 2)}$$

$$\text{Number of all } R_c \text{ units in trimmed resistor network} = y = \left(\frac{1}{\delta}\right) \times 2^{(b-1)} \qquad \text{(Design step 3)}$$

Design Value of conceptual parallel unit $R_c =$ (Design step 4)

$$\left(\frac{R_t}{\delta}\right) \times 2^{(b-1)}$$

Layout Design:

Base resistor = $R_{trim \to base} = \dfrac{R_c}{x}$

Least Significant Bit trim resistor = $R_{trim \to 0} = \dfrac{R_c}{2^0}$

Next Significant Bit trim resistor = $R_{trim \to 1} = \dfrac{R_c}{2^1}$

Next Significant Bit trim resistor = $R_{trim \to 2} = \dfrac{R_c}{2^2}$

Next Significant Bit trim resistor = $R_{trim \to 3} = \dfrac{R_c}{2^3}$

Most Significant Bit trim resistor = $R_{Trim \to (b-1)} = \dfrac{R_c}{2^{(b-1)}}$ Chose a layout unit resistor $R_{layout-unit}$ based on $R_{trim \to 0}$ through $R_{Trim \to (b-1)}$ In order to reduce layout area the center $R_{Trim}$ can be used as $R_{layout-unit}$ For example if we choose $R_{layout-unit} = R_{trim \to 2}$ ⇒$R_{trim \to 0} = 4 \times R_{layout-unit}$, this means $R_{trim \to 0}$ can be made using 4 $R_{layout-unit}$ in series ⇒$R_{trim \to 1} = 2 \times R_{layout-unit}$, this means $R_{trim \to 1}$ can be made using 2 $R_{layout-unit}$ in series ⇒$R_{trim \to 2} = 1 \times R_{layout-unit}$, this means $R_{trim \to 2}$ can be made using 1 $R_{layout-unit}$ in series

⇒

$$R_{trim \to 3} = \frac{R_{layout-unit}}{2},$$

this means $R_{trim \to 3}$ can be made using 2 $R_{layout-unit}$ in parallel

⇒and so on

Notice that in final design and layout $R_c$ is not visible. $R_c$ is only a conceptual design value.

Output Driver Design Flow.

An overall system flowchart proceeds as follows:

type X=resistor of any kind that needs to be controlled

Flow chart of output impedance block

1—design a base resistor in parallel with $2^b$ equal parallel sections of a unit resistor Rc. These Rc sections are built by binary weighted type X resistors controlled digitally.

2—base resistor is designed to have nominal design value when typeX resistors have −delta % different value than their nominal. All $2^b$ Rc sections are switched out.

3—in a case when variation in type X resistors is +delta %, all $2^b$ Rc sections are switched in parallel with base resistor which brings the output impedance down to nominal design value.

4—similarly in nominal case for type X resistor, approx. half of $2^b$ Rc sections are switched in parallel with base resistor which brings the output impedance down to nominal design value.

5—as above for other than extreme resistor variation based on presented mathematical equations.

Output Impedance Change with Changing Digital Control Codes

| For + 25% Increase in impedance | | | | For −25% reduction in impedance | | | |
|---|---|---|---|---|---|---|---|
| Pull-Down | | Pull-Up | | Pull-Down | | Pull-Up | |
| Code | Impedance | Code | Impedance | Code | Impedance | Code | Impedance |
| 31 | 71.6 | 31 | 72.2 | 31 | 44.8 | 31 | 46 |
| 30 | 71 | 30 | 70.9 | 30 | 44.5 | 30 | 45.2 |
| 29 | 72.6 | 29 | 69.6 | 29 | 45.2 | 29 | 44.3 |
| 28 | 70.9 | 28 | 68.4 | 28 | 44 | 28 | 43.5 |
| 27 | 67.3 | 27 | 67.2 | 27 | 41.9 | 27 | 42.8 |
| 26 | 66.7 | 26 | 66.1 | 26 | 41.6 | 26 | 42 |
| 25 | 68 | 25 | 65 | 25 | 42.1 | 25 | 41.3 |
| 24 | 66.4 | 24 | 64 | 24 | 41.1 | 24 | 40.6 |
| 23 | 63.2 | 23 | 62.9 | 23 | 39.3 | 23 | 40 |
| 22 | 62.6 | 22 | 62 | 22 | 39 | 22 | 39.3 |
| 21 | 63.8 | 21 | 61 | 21 | 39.5 | 21 | 38.7 |
| 20 | 62.4 | 20 | 60.1 | 20 | 38.6 | 20 | 38.1 |
| 19 | 59.6 | 19 | 59.2 | 19 | 36.9 | 19 | 37.5 |
| 18 | 59.1 | 18 | 58.4 | 18 | 36.7 | 18 | 37 |
| 17 | 60.2 | 17 | 57.5 | 17 | 37.1 | 17 | 36.4 |
| 16 | 58.9 | 16 | 56.7 | 16 | 36.3 | 16 | 35.9 |
| 15 | 56.4 | 15 | 55.9 | 15 | 34.9 | 15 | 35.4 |
| 14 | 56 | 14 | 55.2 | 14 | 34.7 | 14 | 34.9 |
| 13 | 57 | 13 | 54.4 | 13 | 35.1 | 13 | 34.4 |
| 12 | 55.8 | 12 | 53.7 | 12 | 34.4 | 12 | 34 |
| 11 | 53.6 | 11 | 53 | 11 | 33.1 | 11 | 33.5 |
| 10 | 53.2 | 10 | 52.3 | 10 | 32.9 | 10 | 33.1 |
| 9 | 54.1 | 9 | 51.7 | 9 | 33.3 | 9 | 32.6 |
| 8 | 53.1 | 8 | 51 | 8 | 32.6 | 8 | 32.2 |
| 7 | 51 | 7 | 50.4 | 7 | 31.5 | 7 | 31.8 |
| 6 | 50.7 | 6 | 49.8 | 6 | 31.3 | 6 | 31.4 |
| 5 | 51.5 | 5 | 49.2 | 5 | 31.6 | 5 | 31 |
| 4 | 50.6 | 4 | 48.6 | 4 | 31.1 | 4 | 30.7 |
| 3 | 48.8 | 3 | 48.1 | 3 | 30 | 3 | 30.3 |
| 2 | 48.5 | 2 | 47.5 | 2 | 29.9 | 2 | 30 |
| 1 | 49.2 | 1 | 47 | 1 | 30.2 | 1 | 29.6 |
| 0 | 48.4 | 0 | 46.5 | 0 | 29.7 | 0 | 29.3 |

1 - shaded cells indicate the locked digital code and corresponding impedance vlaue 2 - These results are for an impedance taget between 40.5 Ohm and 49.5 Ohm

Flow Chart of Control

An overall cycle of operation for the control sequence proceeds as follows:

1—increment control code from 0 to $2^b$.

2—monitor output voltage of current based resistance sensor.

3—select the code that generates a pre-determined output voltage (Vref) value at the output of the impedance sensor based on the algorithm presented in steps 3a–3f (see below.)

3a—a precisely known current is multiplied with a factor to get a current (Iknown) with nominal value equal to Inom. Where Inom=Vref/Rreplica_nominal. Note that Rreplica is a type X resistor that can vary with process, temperature and voltage and this scheme compensates for this variation.

3b—Iknown can be digitally increased or decreased in $2^b$ steps to correspond to ±δ% linear variation in resistance (this means Iknown can be digitally increased from Inom×(1/(1+(δ/100))) to Inom×(1/(1−δ/100)) in $2^b$ steps. This change in current is non-linear with respect to the change in the resistance due to Ohm's law relationship.

3c—Iknown is forced across a Replica resistor of with nominal value Rreplica_nominal to get voltage across the replica=Inom×Rreplica_nominal 3b—Iknown is made of digitally controlled currents for ease of design and manufacturing.

3c—when the replica resistors have −delta % variation, select a code that gives voltage across the replica=Inom×(1/(1−δ/100))×Rreplica_nominal×(1−δ/100)—equation 101

3d—when typeX resistors have +δ% variation, select a code that gives voltage across the replica=Inom×(1/(1+δ/100))×Rreplica_nominal×(1+δ/100)—equation 102

3e—when typeX resistors value is K % of nominal, select a code that gives voltage across the replica=Inom (1/K)×Rreplica_nominal×(K)—equation 103

3f—A digital current adjusting block modifies the current LSB step with the digital code that satisfies equation 101, 102, 103.

4—design the output block according to the provided design guide such that the same code gives a target impedance when applied to output impedance block.

Figure 14:
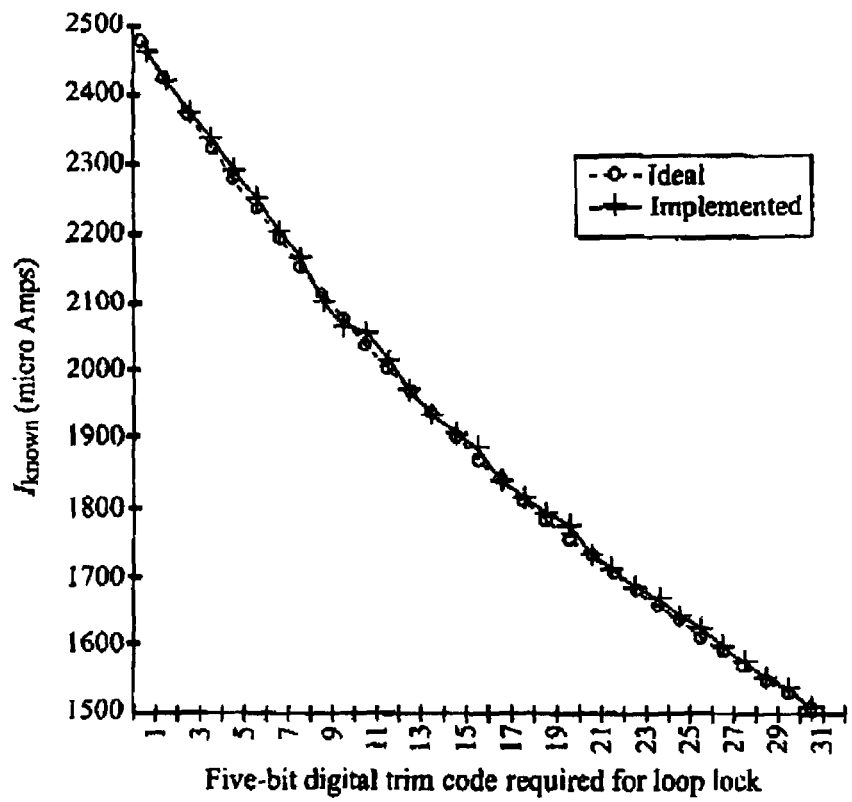
FIG. 14 is a graphical representation of an example of a control sequence for an output block in accordance with an aspect of the invention.

An implementation of this block Is provided for a 5 bit control scheme as follows. FIG. 14 shows $I_{known}$ for a typical 5 bit control scheme vs. locking code; the ideal and an implemented version.

Figure 15:
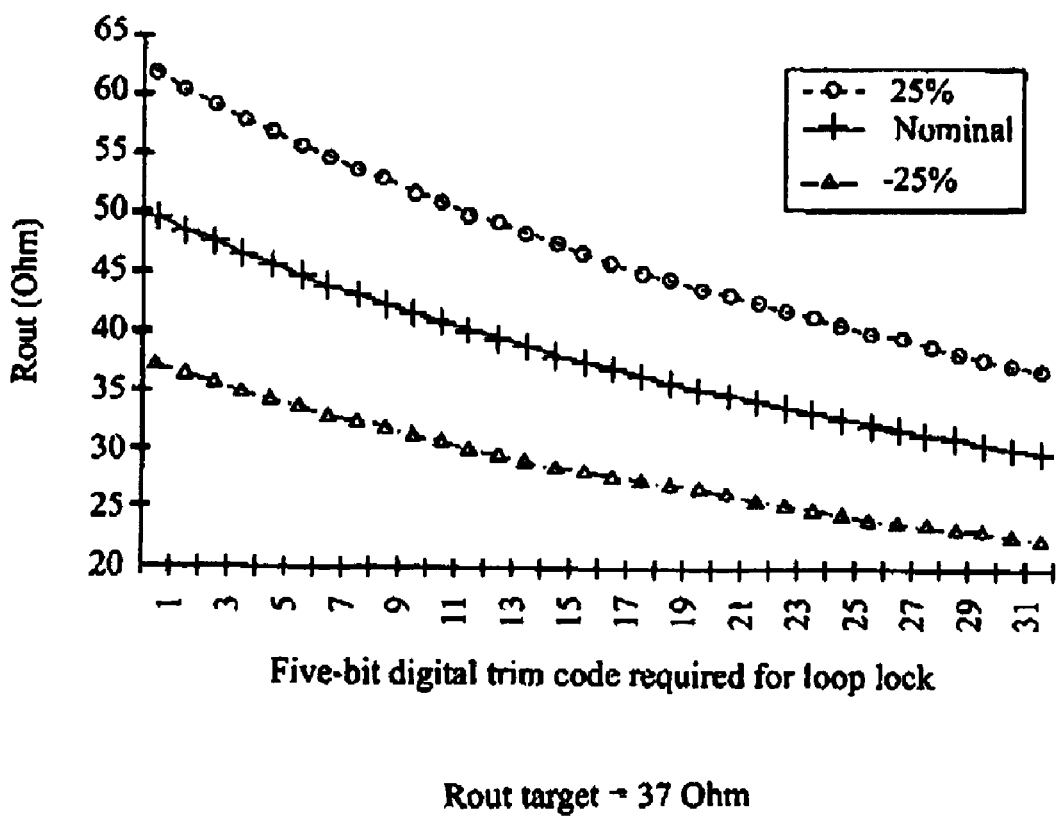
FIG. 15 is a graphical representation of an example of a digital control code required for loop lock In accordance with an aspect of the invention.

FIG. 15 shows Rout (target 37 Ohm) for a typical 5 bit control scheme versus a digital control codes 0–32 for ±25%, nominal and −25% resistance variation.

Mathematical Description of Example Implementation

The system comprises two blocks, a) a control circuit that maintain $V_{ref}$ across a replica resistor as shown in FIGS. 3 & 5 b) an output block that maintains target impedance at the output as shown in FIGS. 8 & 9

Referring to FIG. 8, an example implementation is described mathematically as follows.

S0–S4 are control bits coming from digital. These bits are identical to B0–B4 in value most of the time, however digital controller implementation controls their B0–B4 and S0–S4 relationship. In this particular example implementation S0–S4 and B0–B4 are identical however controller updates S0–S4 at the end of packet.

For the pull down side (FIG. 8), the output resistance can be defined by the following.

$R_{out}$ = impedance to ground at node 807

$R_{drive}$ = impedance to ground at node 816

$R_t = R_{out} - R_{drive} = (R_{trim \to base}) \| (R_{trim \to 4} \times \overline{S4}) \| (R_{trim \to 3} \times \overline{S3}) \| (R_{trim \to 2} \times \overline{S2}) \| (R_{trim \to 1} \times \overline{S1}) \| (R_{trim \to 0} \times \overline{S0})$ where item 806 is $$R_{trim \to base} = \frac{R_{LU}}{20}$$

item 805 is $$R_{trim \to 4} = \frac{R_{LU}}{4}$$

item 804 is $$R_{trim \to 3} = \frac{R_{LU}}{2}$$

item 803 is $$R_{trim \to 2} = \frac{R_{LU}}{1}$$

item 802 is $$R_{trim \to 1} = R_{LU} \times 2$$

item 801 is $$R_{trim \to 0} = R_{LU} \times 4$$

Similar equations apply to FIG. 9.

Mathematical Description of Example Implementation of FIG. 3

Referring to FIG. 3, the control block consists of parallel current sources controlled by digital controller. Parallel current sources are scaled versions of external reference current i.e. $V_{bandgap}/R_{bias}$. These currents are dumped in an on-chip replica resistor to maintain reference voltage.

B0–B4 are control bits that are decoded into following eleven bits using following relationship:

Block 330

Signal 319=B4a=B4

Signal 318=B3a=B3

Signal 325=B3b=B3+B4

Signal 324=B2a=B2

Signal 323=B2b=$\overline{B4B3B2}$

Signal 322=B2c=B4B3B2

Signal 321=B2d=B4B3B2

Signal 317=B1a=B1

Signal 320=B1b=B1$\overline{(B3B4)}$

Signal 316=B0a=B0

Signal 315=B0b=B0(B1+B2+B3)B4

$$I_{ref} = k_{ref} \times \frac{V_{bandgap}}{R_{ext}}$$

(correction needed in FIG. 3)

$$\text{Resistance of block 313} = R_{replica} = R_{trim \to 3} + \frac{R_{drive}}{\alpha}$$

where a is a factor proportional to physical ratio of $R_{trim \to 3}$ and $R_t$. Notice that in this example implementation, $R_{trim \to 3}$ was used for Resistance#391 and $$\frac{R_{drtive}}{\alpha}$$

represents series resistance offered by 392 and 393.

Voltage at node 307 is given by following equation.

$$V_{control} = \quad \text{(II)}$$
$$I_{ref} \times \begin{bmatrix} k_{base} + \{k_{4a} \times B4a\} + \{(k_{3a} \times B3a) + (k_{3b} \times B3b)\} + \\ \{(k_{2a} \times B2a) + (k_{2b} \times B2b) + (k_{2c} \times B2c) + (k_{2d} \times B2d)\} + \\ \{(k_{1a} \times B1a) + (k_{1b} \times B1b)\} + \{(k_{0a} \times B0a) + (k_{0b} \times B0b)\} \end{bmatrix} \times$$
$$R_{replica}$$

In this particular example,

The value of all the design factors ($k_{ref}$, $k_{base}$, $k_{4a}$, $k_{3a}$, $k_{3b}$, $k_{2a}$, $k_{2b}$, $k_{2c}$, $k_{2d}$, $k_{1a}$, $k_{1b}$, $k_{0a}$, $k_{0b}$) is chosen such that for a certain value of B0–B4 when $V_{control}=V_{bandgap}$, a corresponding value of S0–S4 gives Rout=Rdesigntarget.

---

Output Driver Design Rule Flow Chart

---

Objective:

Given ±(δ × 100)% variation in nominal Resistor value, the following design rules describe how to design an output driver/resistance element that offers dynamically trimmed resistance $R_{out}$

↓ controllable within ±(λ × 100) variation where λ ≦ δ.

1) The design target impedance value including resistors and drivers = $R_{out}$ Ohm. Chose the average driver resistance value ≈ $R_{drive}$ Ohms. Variation in $R_{drive}$ will contribute to overall variation in $R_{out}$. However if $R_{drive}$ is chosen as a small portion of $R_{out}$ then the effect of this variation is small.

↓

---

-continued

Output Driver Design Rule Flow Chart

---

2) The variation that this scheme controls is the variation in $R_t$. The design target for output trimmed resistor value = $R_{out} - R_{drive} = R_t$ Ohm. The target variation in $R_t$ is $\pm(\lambda \times 100)$ whereas $\lambda \le \delta$, We choose $\frac{2 \times \delta}{2^b} \le \lambda$

↓

3) Divide total Resistance variation 2 × δ in $2^b$ equal partitions. The partition or "chunk" size is chosen to be significantly smaller than the target variation of 2 × λ. This determine initial estimate for number of bits (b) required.

↓

4) Determine the umber of parallel $R_c$ units in base (untrimmed) resistor =

$$x = \left(\frac{1-\delta}{\delta}\right) \times 2^{(b-1)} \text{ (unique answer)}$$

↓

5) Determine the number of all $R_c$ units in trimmed resistor network = $y = \left(\frac{1}{\delta}\right) \times 2^{(b-1)}$ (unique answer)

↓

6) Determine the value of conceptual parallel unit $$R_c = \left(\frac{R_t}{\delta}\right) \times 2^{(b-1)}$$

↓

7) Determine base resistor = $R_{trim \to base} = \frac{R_c}{x}$, $R_{trim \to 0} = \frac{R_c}{2^0}$, $R_{trim \to 1} = \frac{R_c}{2^1}$, ... , $R_{Trim \to (b-1)} = \frac{R_c}{2^{(b-1)}}$

↓

8) Chose a layout unit resistor $R_{layout-unit}$ based on $R_{trim \to 0}$ through $R_{Trim \to (b-1)}$. Follow the written guidelines to minimize area if needed.

While the invention has been described in connection with what are presently considered to be the most practical and preferred embodiments, it is to be understood that the invention is not limited to the disclosed embodiments, but rather is intended to cover various modifications and equivalent arrangements which are included with the scope of the following claims.

I claim:

1. A system for controlling impedance on a data line comprising:

an output driver circuit for providing an impedance adjustable to a target impedance and responsive to control signals from a control sense circuit;

a control sense circuit, responsive to a reference current for sensing the impedance of the output driver circuit and for providing a control current on an output lead in response to the reference current and to signals from a digital controller, such that the control current is set to a plurality of values between a minimum value and a maximum value by the signals from the step adjustment controller;

a replica circuit comprising a replica branch equal to a portion of $2^b$ (exponent b where b is an integer) parallel resistances of the output driver for converting the control current of the control sense circuit into a control voltage a voltage comparator means for comparing the control voltage to a reference voltage and for producing a feedback signal to the digital controller, such that when the control voltage is equal to the reference voltage the digital controller produces a control signal to the control sense circuit that locks the line driver circuit to the target impedance.

2. A system for controlling impedance according to claim 1 wherein the replica circuit comprises of a plurality of parallel connected resistances that are selectively switchable in or out and for converting the output current of the control sense circuit to a control voltage such that the target impedance is dynamically matched.

3. A system for controlling impedance comprising:

an output circuit for providing a matched impedance with respect to a target impedance; the output circuit comprising a plurality of $2^b$ (exponent b, where b is an integer) parallel connected resistances and having a base impedance value that can be trimmed by switching in or out one or more of the parallel resistances, such that the parallel combination of base resistance and controllably switched in parallel resistances have an equivalent resistance near or equal to the target resistance value when a resistor manufacturing process for components in the system results in a lowest guaranteed resistance, and the parallel combination of base resistance and a portion of $2^b$ (exponent b) controllably switched in parallel resistances have a value near or equal to the target impedance when the resistor-manufacturing process for components results in a highest guaranteed resistance, such that the total manufacturable range of resistivity can be trimmed by $2^b$ individually switchable parallel resistances;

a digital controller responsive to a control sense circuit for providing first control signals representative of uniform increments or decrements, such that for every increment or decrement a change in impedance value of the output circuit is sensed, and for providing second control signals to the driver circuit for adjusting output impedance;

a control sense circuit for sensing and controlling impedance of the output circuit, having an output connected to the digital controller, and responsive to a reference current, to first control signals from the digital controller and to a value of a replica circuit;

the replica circuit comprising a resistive branch replica of the output circuit having an impedance proportional or equal to the target impedance, such that scaled versions of the reference current are sunk in or sourced out of the replica circuit, and a constant voltage drop across the replica circuit corresponds to a first control signal value that when applied to the second control signal provides the target impedance of the output driver.

4. A system according to claim 3 further comprising:

a step adjustment controller responsive to the first control signals for adjusting an increment/decrement step size of the scaled reference current, such that the step size increases or decreases with an absolute value of the first control signal and for controlling a sum of the scaled versions of the reference current, and the step adjustment controller adjusts a sum of the scaled versions of the reference current in response to first control signals, such that for each value of first control signal that when applied to the second control signal results in output driver impedance equal to target impedance, the voltage drop across the replica resistance due to the sum of the scaled versions of the reference current is equal to a predetermined reference voltage.

5. A system according to claim 3 wherein the plurality of parallel connected resistances comprise parallel sections of binary weighted resistors, each having a constant value, such that for every increment or decrement of the first control signals a change in impedance in the output circuit corresponds to switching in or out of one or more sections of resistors, and wherein the control sense circuit determines a first control signal to be equal to a value based on the scaled combination of reference current and the resistive branch replica, the digital controller locks to that value and provides a second control signal to the output circuit that adjusts output impedance to be equal to the target impedance.

6. A system according to claim 3, wherein the parallel combination of base resistance and a portion of $2^b$ (exponent b) controllably switched-in parallel resistances have a value near or equal to target impedance when the resistor-manufacturing process for components results in a value between highest and lowest guaranteed resistance, such that the total manufacturable range of resistivity can be trimmed by $2^b$ (exponent b) individually switchable parallel resistances.

* * * * *